(12) United States Patent
Yoshizumi

(10) Patent No.: US 11,892,878 B2
(45) Date of Patent: Feb. 6, 2024

(54) ELECTRONIC DEVICE

(71) Applicant: SEMICONDUCTOR ENERGY LABORATORY CO., LTD., Atsugi (JP)

(72) Inventor: Kensuke Yoshizumi, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/680,419

(22) Filed: Feb. 25, 2022

(65) Prior Publication Data
US 2022/0179454 A1 Jun. 9, 2022

Related U.S. Application Data

(63) Continuation of application No. 16/683,348, filed on Nov. 14, 2019, now Pat. No. 11,281,256, which is a
(Continued)

(30) Foreign Application Priority Data

Nov. 18, 2015 (JP) .................................. 2015-225499

(51) Int. Cl.
*G06F 1/16* (2006.01)
*H04M 1/02* (2006.01)
(Continued)

(52) U.S. Cl.
CPC ............. *G06F 1/1641* (2013.01); *G04G 9/04* (2013.01); *G04G 17/045* (2013.01); *G06F 1/163* (2013.01); *G06F 1/1624* (2013.01); *G06F 1/1626* (2013.01); *G06F 1/1643* (2013.01); *G06F 1/1652* (2013.01); *G06F 1/1681* (2013.01);
(Continued)

(58) Field of Classification Search
None
See application file for complete search history.

(56) References Cited

U.S. PATENT DOCUMENTS 8,024,019 B2    9/2011  Miyaoka
8,116,506 B2    2/2012  Kuroda et al.
(Continued)

FOREIGN PATENT DOCUMENTS

EP          1947901 A      7/2008
EP          2031839 A      3/2009
(Continued)

*Primary Examiner* — Anthony J Frost
(74) *Attorney, Agent, or Firm* — Fish & Richardson P.C.

(57) ABSTRACT

An electronic device has a structure in which two portions between which a bent portion of a display panel is positioned are each fixed to a housing. The electronic device takes two forms of a form in which the display panel is opened and a form in which the display panel is folded in three. The electronic device includes a mechanism for sliding two housings parallel to each other. The display panel is changed in shape so that a portion where a display surface of the display panel is convexly curved and a portion where the display surface of the display panel is concavely curved in the folded state move in directions parallel and opposite to each other. At this time, the two portions of the display panel which are supported by the housings are slid while their display surfaces maintain a state parallel to each other.

3 Claims, 25 Drawing Sheets

Related U.S. Application Data continuation of application No. 15/350,263, filed on Nov. 14, 2016, now Pat. No. 10,481,638.

(51) Int. Cl.
| | |
|---|---|
| *G04G 17/04* | (2006.01) |
| *G04G 9/04* | (2006.01) |
| *H10K 50/80* | (2023.01) |
| *H10K 59/10* | (2023.01) |
| *H10K 59/12* | (2023.01) |
| *H10K 59/40* | (2023.01) |
| *H10K 102/00* | (2023.01) |

(52) U.S. Cl.
CPC ....... *H04M 1/0237* (2013.01); *H04M 1/0247* (2013.01); *H04M 1/0268* (2013.01); *C09K 2323/00* (2020.08); *H04M 1/0239* (2013.01); *H04M 2201/38* (2013.01); *H04M 2250/16* (2013.01); *H04M 2250/22* (2013.01); *H10K 50/80* (2023.02); *H10K 59/10* (2023.02); *H10K 59/12* (2023.02); *H10K 59/40* (2023.02); *H10K 2102/3026* (2023.02)

(56) References Cited

U.S. PATENT DOCUMENTS

| | | | |
|---|---|---|---|
| 8,477,464 | B2 | 7/2013 | Visser et al. |
| 8,630,085 | B2 | 1/2014 | Sawada |
| 9,088,006 | B2 | 7/2015 | Yamazaki et al. |
| 9,395,070 | B2 | 7/2016 | Endo |
| 9,719,665 | B2 | 8/2017 | Hirakata et al. |
| 10,119,683 | B2 | 11/2018 | Hirakata et al. |
| 10,125,955 | B2 | 11/2018 | Hirakata et al. |
| 10,481,638 | B2 | 11/2019 | Yoshizumi |
| 10,711,980 | B2 | 7/2020 | Hirakata et al. |
| 2009/0221335 | A1 | 9/2009 | Nakazawa |
| 2010/0188350 | A1 | 7/2010 | Sawada |
| 2011/0025479 | A1 | 2/2011 | Hwang et al. |
| 2011/0188189 | A1 | 8/2011 | Park et al. |
| 2012/0218688 | A1* | 8/2012 | Pegg ................... H04M 1/0239 361/679.01 |
| 2012/0242599 | A1 | 9/2012 | Seo et al. |
| 2013/0044410 | A1 | 2/2013 | Verschoor et al. |
| 2015/0009128 | A1 | 1/2015 | Matsumoto |
| 2015/0014681 | A1 | 1/2015 | Yamazaki |
| 2015/0016126 | A1 | 1/2015 | Hirakata et al. |
| 2015/0023030 | A1* | 1/2015 | Tsukamoto ............. G06F 1/162 362/419 |
| 2015/0028328 | A1 | 1/2015 | Ikeda et al. |
| 2015/0169274 | A1 | 6/2015 | Holung et al. |
| 2015/0230349 | A1 | 8/2015 | Lee et al. |
| 2020/0109838 | A1 | 4/2020 | Hirakata et al. |

FOREIGN PATENT DOCUMENTS

| | | |
|---|---|---|
| EP | 2237532 A | 10/2010 |
| JP | 59-135960 A | 8/1984 |
| JP | 2009-059102 A | 3/2009 |
| JP | 2009-071588 A | 4/2009 |
| JP | 2010-530553 | 9/2010 |
| JP | 2011-130466 A | 6/2011 |
| JP | 2011-221189 A | 11/2011 |
| JP | 2014-197522 A | 10/2014 |
| JP | 2015-049483 A | 3/2015 |
| JP | 2015-130320 A | 7/2015 |
| JP | 2015-187725 A | 10/2015 |
| JP | 6850587 | 3/2021 |
| WO | WO-2007/052835 | 5/2007 |
| WO | WO-2008/153402 | 12/2008 |
| WO | WO-2015/005230 | 1/2015 |
| WO | WO-2015/136403 | 9/2015 |

* cited by examiner

FIG. 1A1
FIG. 1A2
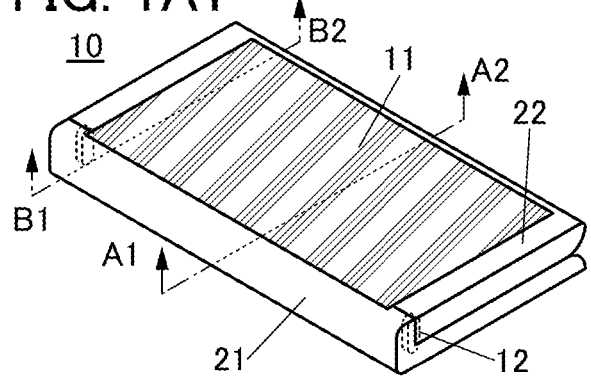
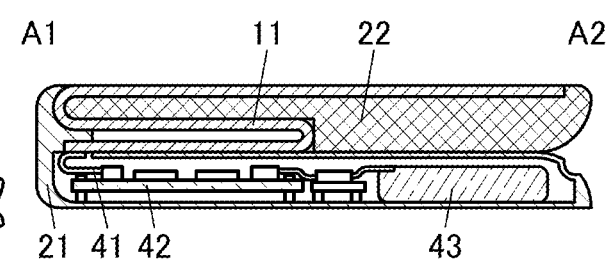
FIG. 1B1
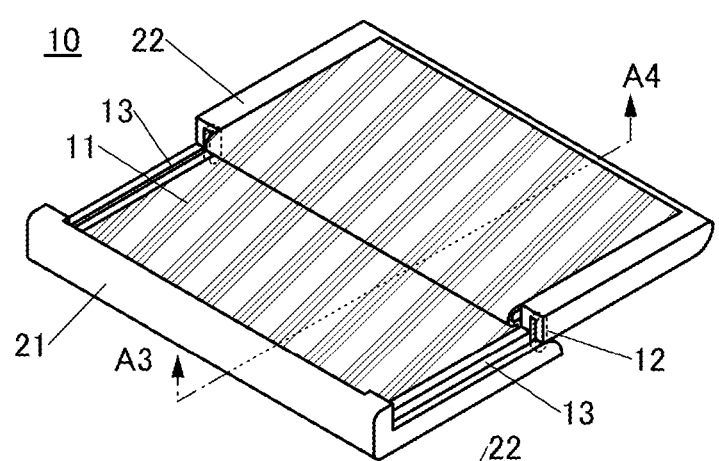
FIG. 1B2
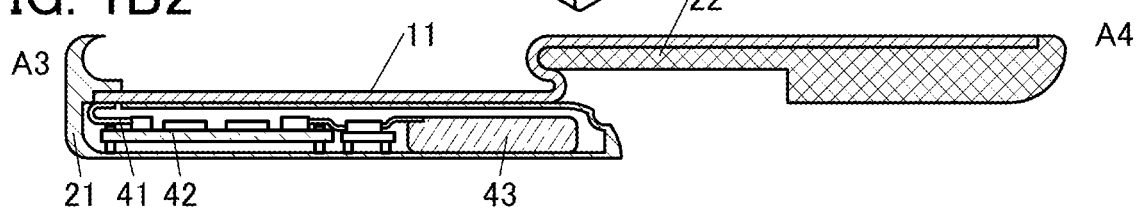
FIG. 1C1
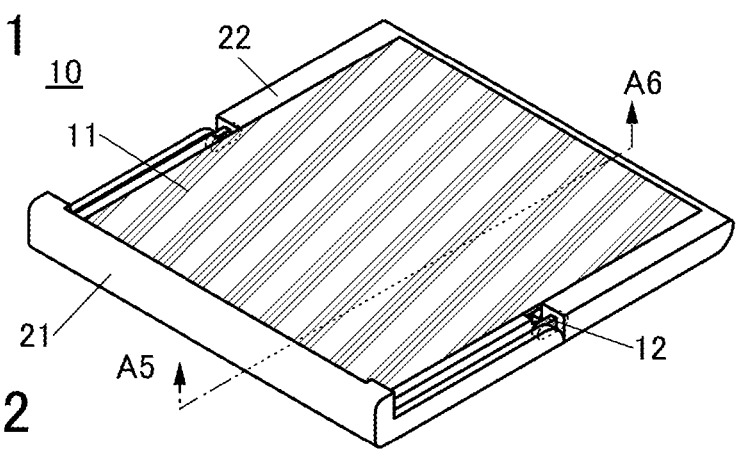
FIG. 1C2
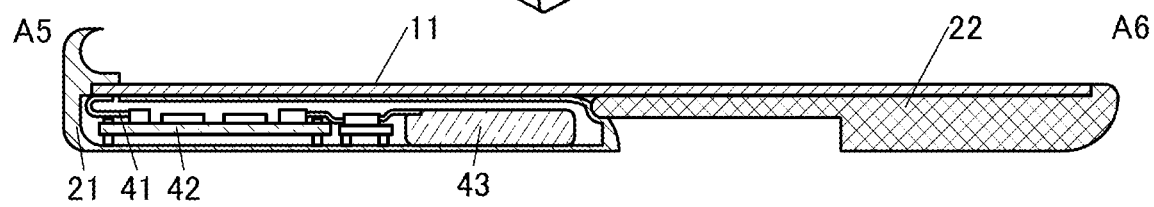

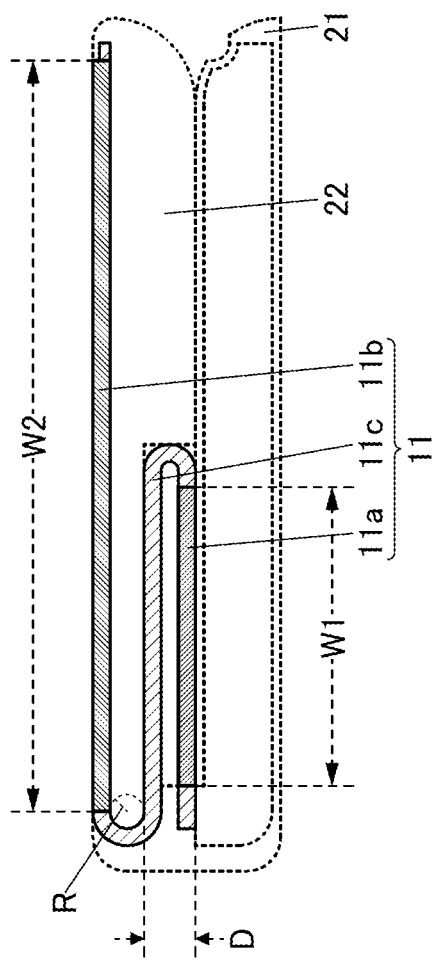
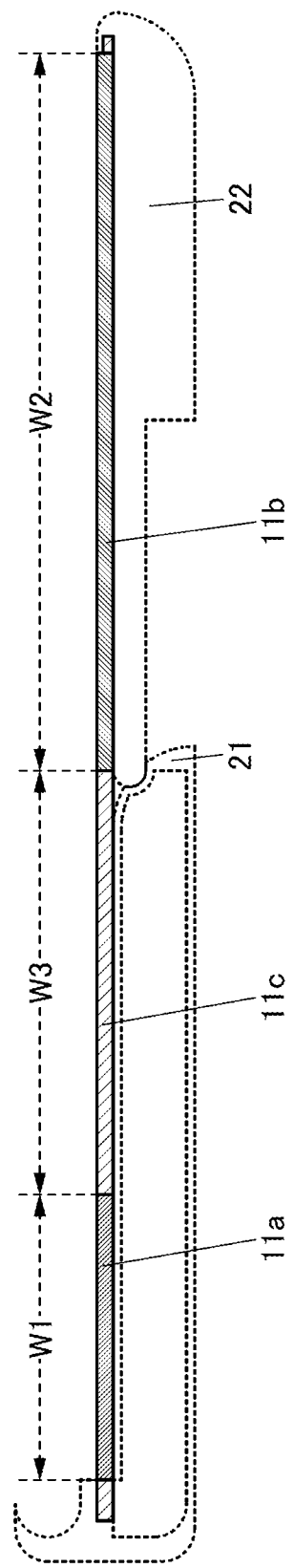

FIG. 7A1
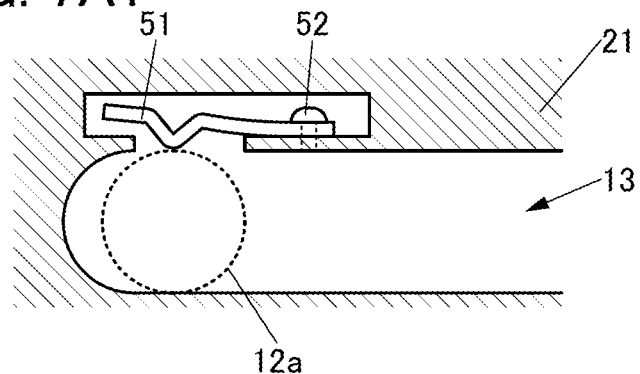
FIG. 7A2
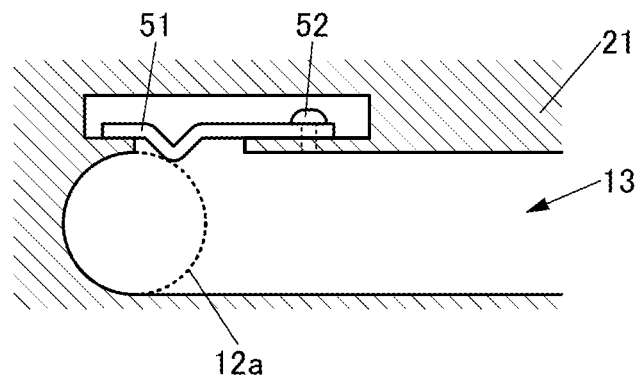
FIG. 7B1
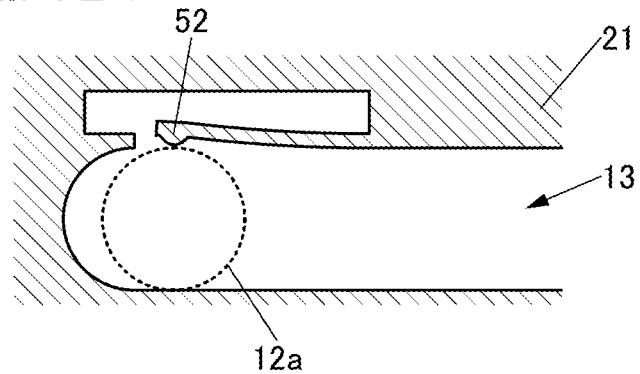
FIG. 7B2
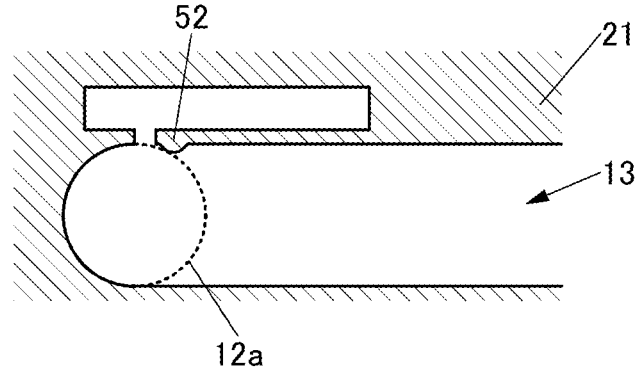

FIG. 8A1
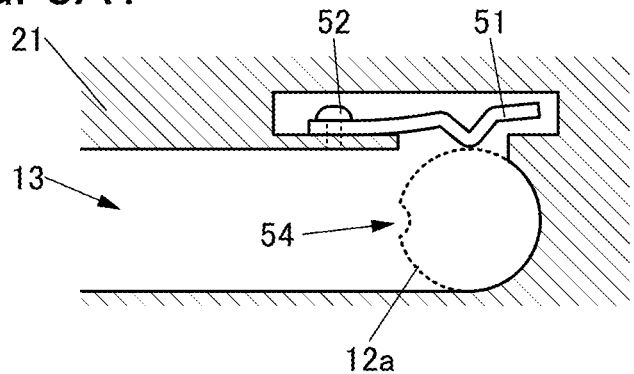
FIG. 8A2
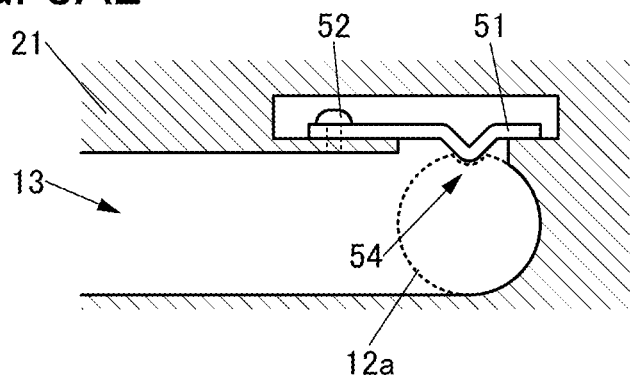
FIG. 8B
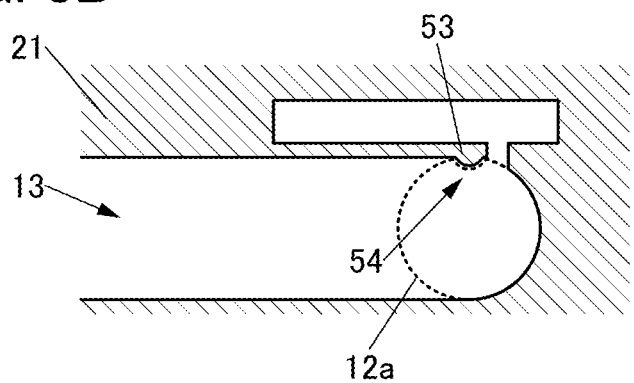
FIG. 8C
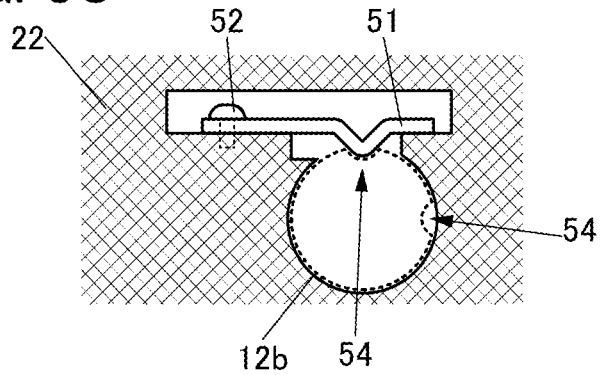

FIG. 9A
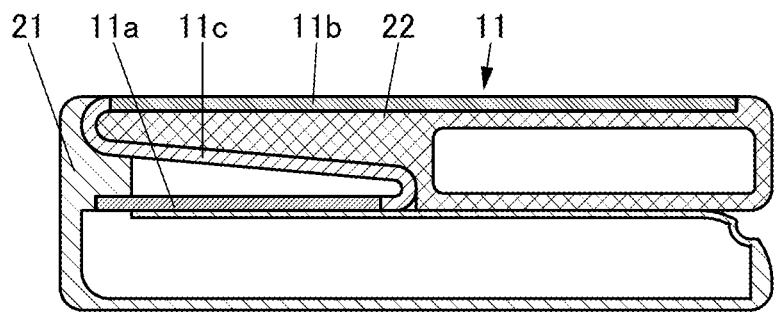
FIG. 9B
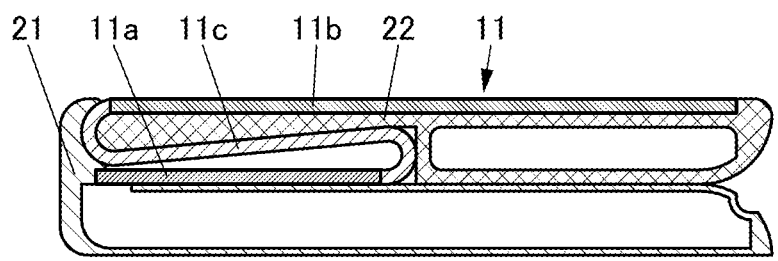
FIG. 9C1
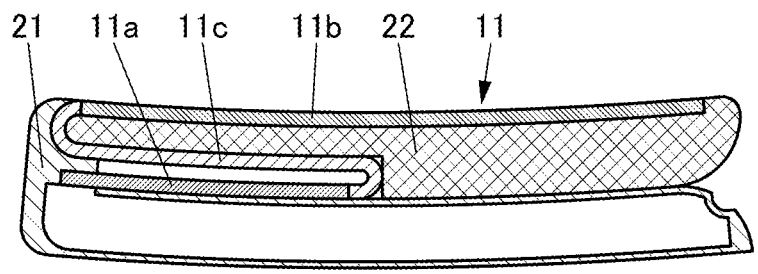
FIG. 9C2
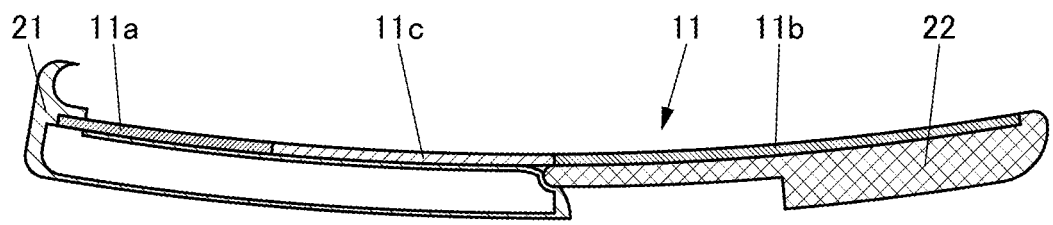

ELECTRONIC DEVICE

CROSS-REFERENCE TO RELATED APPLICATIONS

This application is a continuation of U.S. application Ser. No. 16/683,348, filed Nov. 14, 2019, now allowed, which is a continuation of U.S. application Ser. No. 15/350,263, filed Nov. 14, 2016, now U.S. Pat. No. 10,481,638, which claims the benefit of a foreign priority application filed in Japan as Serial No. 2015-225499 on Nov. 18, 2015, all of which are incorporated by reference.

BACKGROUND OF THE INVENTION

1. Field of the Invention

One embodiment of the present invention relates to an electronic device including a display device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a method for driving any of them, and a method for manufacturing any of them.

2. Description of the Related Art

Electronic devices including display devices have recently been diversified. Examples of the electronic devices include cellular phones, smartphones, tablet terminals, and wearable terminals.

Examples of the display device include, typically, a light-emitting device including a light-emitting element such as an organic electroluminescent (EL) element or a light-emitting diode (LED), a liquid crystal display device, and electronic paper performing display by an electrophoretic method or the like.

Patent Document 1 discloses a flexible light-emitting device in which an organic EL element is used.

REFERENCE

Patent Document

[Patent Document 1] Japanese Published Patent Application No. 2014-197522

SUMMARY OF THE INVENTION

In recent years, electronic devices with large display regions have been required. When display regions are large, there are advantages that browsability is improved and the amount of information that can be displayed is increased, for example. However, in portable electronic devices, large display regions might entail a reduction in portability. For this reason, the browsability of display and portability are difficult to improve at the same time.

An object of one embodiment of the present invention is to provide an electronic device with a large display region. Another object is to improve the portability of an electronic device. Another object is to provide an electronic device in which the size of a display region can be changed. Another object is to provide an electronic device in which the size of a display region can be selected depending on the intended use. Another object is to provide a novel electronic device.

One embodiment of the present invention is an electronic device including a flexible display panel. The display panel includes a first portion, a second portion, and a third portion. The third portion is flexible and positioned between the first portion and the second portion. The display panel includes a first display surface positioned on the first portion, a second display surface positioned on the second portion, and a third display surface positioned on the third portion. The display panel can be changed in shape between a first form and a second form. The first form is a form in which the third portion is flat and the first display surface, the second display surface, and the third display surface are positioned parallel to each other. The second form is a form in which the third portion includes a first curved portion where part of the third display surface is convexly curved and a second curved portion where another part of the third display surface is concavely curved, and part of the first display surface and part of the second display surface overlap and are parallel to each other. When the display panel is in the second form, the third portion is changed in shape to change the width between the first curved portion and the second curved portion, so that the relative positions of the first portion and the second portion are changed while the first display surface and the second display surface maintain a state parallel to each other.

When the display panel is changed in shape between the first form and the second form, the third portion is preferably changed in shape so that the relative positions of the first portion and the second portion in a direction perpendicular to the first display surface are changed while the first display surface and the second display surface maintain the state parallel to each other.

When the display panel is in the second form, it is preferable that the portion where the third display surface is concavely curved in the third portion be positioned on the first portion side and the portion where the third display surface is convexly curved in the third portion be positioned on the second portion side. At this time, the area of the second display surface is preferably larger than that of the first display surface.

The area of a display region in the first form is preferably 1.1 times or more and 3 times or less that of a display region in the second form.

The electronic device preferably includes a first housing supporting the first portion, a second housing supporting the second portion, and a mechanism for slidably connecting the first housing to the second housing.

The electronic device preferably includes a hinge including a first shaft and a second shaft which are parallel to each other. At this time, the first housing and the hinge are connected to each other so as to be rotatable on the first shaft, and the second housing and the hinge are connected to each other so as to be rotatable on the second shaft. The first housing or the second housing preferably includes a slide rail extending in a direction intersecting with the first shaft. At this time, it is preferable that the hinge be slidably attached along the slide rail.

The electronic device is preferably capable of changing in shape in the following manner. When the display panel is in the first form, the hinge is positioned at one end of the slide rail. When the display panel is changed from the first form to the second form, the relative positions of the first housing and the second housing in a direction perpendicular to the first display surface are changed by the rotation of the hinge. When the display panel is in the second form, the hinge is slid along the slide rail, whereby the first housing or the second housing is slid along the slide rail.

The second housing preferably includes a cut-out portion in a portion on a side opposite to a side on which the second portion is supported. In addition, when the display panel is in the second form, it is further preferable that the third portion be held in a space formed between the first housing and the second housing by the cut-out portion.

The second housing preferably includes a projection having a convex surface in a portion overlapping with the third portion. In addition, when the display panel is in the second form, it is further preferable that the third portion be curved along the projection of the second housing.

The electronic device preferably includes a first lock mechanism for locking the relative positions of the first housing and the second housing when the display panel is in the first form. In addition, the electronic device preferably includes a second lock mechanism for locking the relative positions of the first housing and the second housing when the display panel is in the second form and the first display surface is covered with at least one of the second portion, the third portion, and the second housing.

The electronic device preferably includes a first vibrating element and a second vibrating element. At this time, it is further preferable that the first vibrating element and the second vibrating element be capable of vibrating the first housing and the second housing, respectively. It is much further preferable that the number of vibrations be different between the first vibrating element and the second vibrating element.

According to one embodiment of the present invention, an electronic device with a large display region is provided. In addition, the portability of an electronic device is improved. In addition, an electronic device in which the size of a display region can be changed is provided. In addition, an electronic device in which the size of a display region can be selected depending on the intended use is provided. In addition, a novel electronic device is provided.

BRIEF DESCRIPTION OF THE DRAWINGS

In the accompanying drawings:

FIGS. 1A1, 1A2, 1B1, 1B2, 1C1, and 1C2 illustrate a structural example of an electronic device of an embodiment;

FIGS. 2A and 2B illustrate a structural example of an electronic device of an embodiment;

FIGS. 7A1, 7A2, 7B1, and 7B2 illustrate structural examples of an electronic device of an embodiment;

FIGS. 8A1, 8A2, 8B, and 8C illustrate structural examples of an electronic device of an embodiment;

FIGS. 9A, 9B, 9C1, and 9C2 illustrate structural examples of an electronic device of an embodiment;

DETAILED DESCRIPTION OF THE INVENTION

Figure 3A:
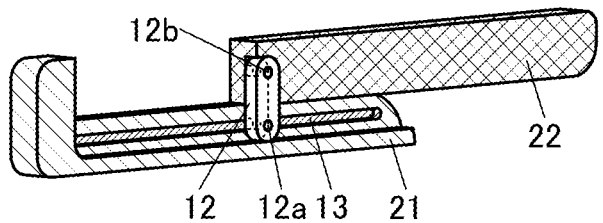
FIGS. 3A to 3F illustrate a structural example of an electronic device of an embodiment.

Embodiments will be described in detail with reference to the drawings. Note that the present invention is not limited to the following description, and it will be easily understood by those skilled in the art that various changes and modifications can be made without departing from the spirit and scope of the present invention. Thus, the present invention should not be construed as being limited to the description in the following embodiments.

Note that in structures of the invention described below, the same portions or portions having similar functions are denoted by the same reference numerals in different drawings, and description thereof is not repeated. Furthermore, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

Note that in this specification and the like, ordinal numbers such as "first" and "second" are used in order to avoid confusion among components and do not limit the number.

Embodiment 1

In this embodiment, structural examples of an electronic device of one embodiment of the present invention will be described.

An electronic device of one embodiment of the present invention includes a display panel which is partly flexible and bendable. The electronic device can take two forms of a form in which the display panel is opened and a form in which the display panel is folded in three.

The electronic device has a structure in which two portions between which a bent portion of the display panel is positioned are each fixed to a housing. In the form in which the display panel is folded in three, the display panel includes a portion where a display surface is convexly curved and a portion where the display surface is concavely curved. In addition, when the electronic device includes a mechanism for sliding the two housings parallel to each other, the display panel can be changed in shape so that the two curved portions move in directions parallel and opposite to each other. With such a structure, the two portions of the display panel which are supported by the housings can be slid while maintaining their display surfaces parallel to each other.

The electronic device of one embodiment of the present invention can display an image on a seamless large display region when the display panel is opened, and thus has high browsability. The electronic device can be reduced in size when the display panel is folded in three, and thus has high portability. In addition, the display panel can be changed in shape so that the two housings are slid when folded; thus, a movable range in the height direction (a direction perpendicular to the display surface) of the electronic device can be minimized Thus, one of the housings does not need to be lifted and the electronic device can be changed between the two forms by a simple operation of sliding one of the housings; as a result, the electronic device with improved convenience can be provided. Since the electronic device can be changed in shape by such a simple operation, the electronic device can be operated with one hand.

Specifically, the following structure can be employed, for example.

Structural Example

FIGS. 1A1, 1B1, and 1C1 are perspective schematic views of an electronic device 10. The electronic device 10 includes a flexible display panel 11. FIG. 1A1 illustrates a state where the display panel 11 is folded. FIG. 1C1 illustrates a state where the display panel 11 is opened. FIG. 1B1 illustrates a state between the state of FIG. 1A1 and the state of FIG. 1C1.

FIG. 1A2 is a cross-sectional schematic view taken along the section line A1-A2 in FIG. 1A1. FIG. 1B2 is a cross-sectional schematic view taken along the section line A3-A4 in FIG. 1B1. FIG. 1C2 is a cross-sectional schematic view taken along the section line A5-A6 in FIG. 1C1.

The electronic device 10 includes the display panel 11, a hinge 12, a housing 21, and a housing 22. The display panel 11 includes a flexible and bendable portion (also referred to as a third portion). The display panel 11 also includes a portion supported by and fixed to the housing 21 (also referred to as a first portion) and a portion supported by and fixed to the housing 22 (also referred to as a second portion) which are provided so that the third portion is interposed therebetween. Each of the two portions of the display panel 11 which are supported by the housing 21 and the housing 22 does not need to be flexible.

The housing 21 and the housing 22 are joined together with the hinge 12. The hinge 12 and the housing 21 are joined together so that the housing 22 can be slid in a direction parallel to a display surface of the display panel 11 with a slide rail 13 included in the housing 21.

An example in which a printed circuit board 42, a battery 43, and the like are included in the housing 21 is illustrated in FIGS. 1A1, 1A2, 1B1, 1B2, 1C1, and 1C2. A variety of ICs are mounted on the printed circuit board 42. Part of a flexible printed circuit (FPC) 41 connected to an end portion of the display panel 11 is pulled into the housing 21 and connected to a terminal included in the printed circuit board 42. In FIGS. 1A1, 1A2, 1B1, 1B2, 1C1, and 1C2, the housing 21 can be referred to as a main body.

The housing 22 includes a cut-out portion on the side opposite to the side on which the display panel 11 is supported. In other words, the housing 22 includes a depression thinner than other portions on the side opposite to the side on which the display panel 11 is supported.

FIGS. 1A1 and 1A2 illustrate a state where the two housings overlap with each other so that the housing 22 is positioned over the housing 21 (also referred to as a state where the electronic device 10 is closed). The display panel 11 is folded at two portions of a portion where the display surface is convexly curved and a portion where the display surface is concavely curved. The flexible portion of the display panel 11 is held in a space between the housing 21 and the cut-out portion of the housing 22.

An end portion of the housing 22 is processed so as to have a curved surface. The display surface of the display panel 11 is convexly curved along the curved surface of the housing 22.

A portion which is partly thicker than other portions and protrudes to the display surface side is included in an end portion of the housing 21 and the vicinity thereof. The portion further includes a portion processed into a concaved shape to fit the convex-curved portion of the display panel 11 therein. That is, when the display panel 11 is folded, the protruding portion of the housing 21 has a function of protecting the surface of the curved portion. When the display panel 11 is spread, by holding the protruding portion of the housing 21, a user can hold the electronic device 10 easily even when the position of the center of gravity is changed by sliding the housing 22. Note that the protruding portion of the housing 21 may be held in the housing 21 when the display panel 11 is flat. In that case, a projection is not on the display surface side when the display panel 11 is flat, and thus, a simple design can be achieved.

In the state of FIGS. 1A1 and 1A2, an image can be displayed on the portion of the display panel 11 of the electronic device 10 that is supported by the housing 22.

The electronic device 10 can be changed in shape from the state of FIGS. 1A1 and 1A2 to the state of FIGS. 1B1 and 1B2 when the housing 21 and the housing 22 are slid relatively to each other. At this time, the hinge 12 is slid along the slide rail 13 included in the housing 21, whereby the housing 21 and the housing 22 can be slid relatively to each other. FIGS. 1A1 and 1A2 illustrate a state where the hinge 12 is positioned at one end of the slide rail 13. FIGS. 1B1 and 1B2 illustrate a state where the hinge 12 is positioned at the other end of the slide rail 13.

Furthermore, the electronic device 10 can be changed in shape from the state of FIGS. 1B1 and 1B2 to the state of FIGS. 1C1 and 1C2 by the rotation of the hinge 12.

In the state of FIGS. 1C1 and 1C2, the flexible portion of the display panel 11 is flat and the display surfaces of the portion supported by the housing 21, the portion supported by the housing 22, and the flexible portion of the display panel 11 are positioned on the same plane. Thus, in this state, the electronic device 10 can display an image on the entire display region of the display panel 11.

The display region of the electronic device 10 illustrated in FIGS. 1A1, 1A2, 1B1, 1B2, 1C1, and 1C2 can be extended when the housing 22 is slid in a short-side direction of the housing 21. The area of the display region of the display panel 11 in an opened state can be approximately doubled as compared with that of the display panel 11 in a folded state. In the case where the display region of the display panel 11 in the folded state is rectangular, which means it has an aspect ratio of 4:3, 16:9, or the like, the display region is extended so that the aspect ratio of the display region is reduced when the display panel 11 is spread. For example, like windows associated with applications, a plurality of vertically long images and a plurality of horizontally long images can be arranged and displayed in the horizontal direction and the vertical direction, respectively. Thus, operations with a plurality of applications can be performed at the same time without changing a screen, resulting in improvement in convenience. In addition, an aspect ratio of an application such as an electronic book can be made close to that of a book in an opened state, and thus, the visibility can be improved.

The electronic device 10 with such a structure is highly portable when the display panel 11 is folded. When the display panel 11 is opened, the electronic device 10 is highly browsable because of the seamless large display region. That is, the electronic device 10 is an electronic device in which the browsability of display and portability are improved at the same time.

Relationship Between Display Panel and Housing

FIG. 2A is a schematic cross-sectional view of the display panel 11 that is folded. FIG. 2B is a schematic cross-sectional view of the display panel 11 that is spread. Note that the housing 21 and the housing 22 are denoted by dashed lines to describe the positional relationship between the display panel 11 and the housings 21 and 22.

The display panel 11 includes three portions (a portion 11a, a portion 11b, and a portion 11c). The portion 11a is a portion fixed to the housing 21. The portion 11b is a portion fixed to the housing 22. The portion 11c is a portion which is positioned between the portion 11a and the portion 11b, has flexibility, and is not fixed to any housing. Each of the three portions includes a plurality of pixels and can display an image or the like on the display surface side. In FIGS. 2A and 2B, the three portions are denoted by different hatching patterns to distinguish the portions from each other.

Here, the width of the portion 11a fixed to the housing 21 in a direction parallel to a slide direction of the housing is referred to as a width W1. The width of the portion 11b fixed to the housing 22 in the direction parallel to the slide direction of the housing is referred to as a width W2. The width between the portion 11a and the portion 11b, that is, the width of the portion 11c in the direction parallel to the slide direction of the housing is referred to as a width W3. Here, the width W3 of the portion 11c corresponds to a difference obtained by subtracting the width W1 and the width W2 from the distance between an end portion of the portion 11a and an end portion of the portion 11b on the opposite side (i.e., the width of the display region of the display panel 11).

The height of a space formed between the housing 21 and the housing 22 by the cut-out portion of the housing 22 is referred to as a height D. The curvature radius of the projection including the convex surface of the housing 22 is referred to as a curvature radius R.

The portion 11c of the display panel 11 has a shape curved along the convex surface of the housing 22. Accordingly, the curvature radius of the projection is larger than the minimum curvature radius with which the display panel 11 can be curved without being damaged. For example, the curvature radius R can be greater than or equal to 0.5 mm and less than or equal to 50 mm, preferably greater than or equal to 1 mm and less than or equal to 30 mm, further preferably greater than or equal to 1 mm and less than or equal to 20 mm, still further preferably greater than or equal to 1 mm and less than or equal to 10 mm. As the curvature radius R is smaller, the thickness of the electronic device 10 can be reduced.

The height D of the space formed between the housing 21 and the housing 22 defines the curvature radius of a portion which is curved so that the display surface is placed inward of the portion 11c of the display panel 11. Specifically, the curvature radius of the portion 11c on the display surface side is a difference obtained by subtracting the thickness of the display panel 11 from a half of the length of the height D. Thus, the height D preferably has a value with which the display panel 11 can be curved without being damaged. For example, the height D of the space can be greater than or equal to 1 mm and less than or equal to 100 mm, preferably greater than or equal to 2 mm and less than or equal to 60 mm, further preferably greater than or equal to 2 mm and less than or equal to 40 mm, still further preferably greater than or equal to 2 mm and less than or equal to 20 mm.

The width W3 of the portion 11c is preferably larger than the width W1 of the portion 11a. Specifically, at least when the display panel 11 is folded, the width W3 of the portion 11c is preferably set so that the portion 11a is placed inward the portion 11c when seen from the display surface side.

The width W2 is preferably close to the sum of the width W1 and the width W3. Accordingly, the widths of the housing 21 and the housing 22 can be substantially the same, so that the electronic device 10 in a state where the display panel 11 is folded can be reduced in size. Alternatively, the width W2 may be larger than the sum of the width W1 and the width W3. Accordingly, the display region of the electronic device 10 in the state where the display panel 11 is folded can be large. Specifically, the width W2 is preferably 75% or more and 200% or less, further preferably 80% or more and 180% or less, still further preferably 85% or more and 150% or less of the sum of the width W1 and the width W3.

Here, the width W2 is preferably larger than the width W1 because the display region of the display panel 11 in the folded state can be large. When the display panel 11 is folded, the widths W1 and W2 are preferably set so that the portion 11a is placed inward the portion 11b when seen from the display surface side. Thus, when the display panel 11 is folded, the portion 11a is covered with the portion 1ib, whereby the portion 11a can be prevented from being visually recognized by a user and can be protected, which is preferable. The width W2 is preferably larger than 1 time and less than or equal to 10 times, further preferably larger than or equal to 1.2 times and less than or equal to 7 times, still further preferably larger than or equal to 1.5 times and less than or equal to 5 times, yet still further preferably larger than or equal to 2 times and less than or equal to 3.5 times the width W1.

Alternatively, a structure in which the display panel 11 is not fixed to the housing 21 at the portion 11a, which is part of the display region, but fixed to the housing 21 through an FPC or the like can be employed. In that case, however, when the display panel 11 is spread, part of the display region might be apart from the housing 21 or an FPC or the like might be broken due to excessive force. Consequently, as described above, the portion 11a, which is part of the display region, and the housing 21 are preferably fixed at a surface where they are in contact with each other.

Slide Mechanism

An example of a mechanism for changing the relative positions of the housing 21 and the housing 22 is described below.

FIG. 3A is a perspective view of the electronic device 10 taken along the section line B1-B2 in FIG. 1A1 which illustrates part of each of the housing 21, the housing 22, and the hinge 12. The hinge 12 includes two shafts (a shaft 12a and a shaft 12b).

In the housing 21, two depressions are provided in movable regions of a pair of hinges 12 as illustrated in FIG. 1B1 and the like. FIG. 3A illustrates a cross section of one of the two depressions. A belt-shaped depression functioning as the slide rail 13 is provided on the side surface of the depression. The shaft 12a fits in the depression of the slide rail 13 and can be slid along the slide rail 13. The housing 22 and the hinge 12 are attached to each other so as to be rotatable on the shaft 12b.

Figure 3B:
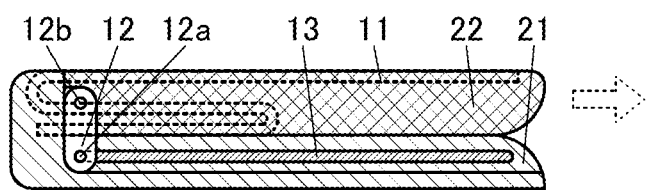
Figure 3C:
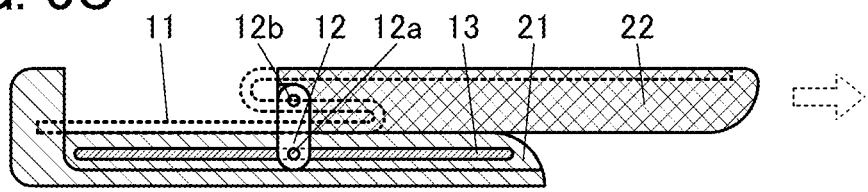
Figure 3D:
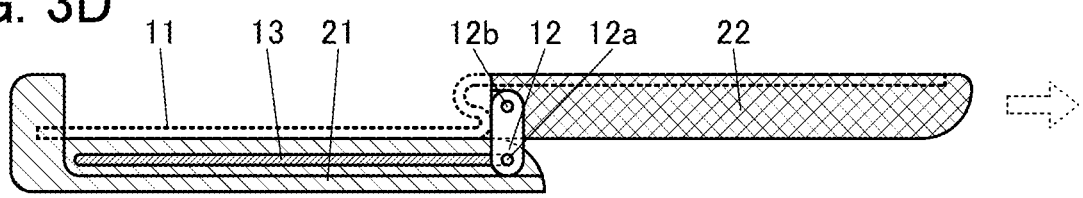
Figure 3E:
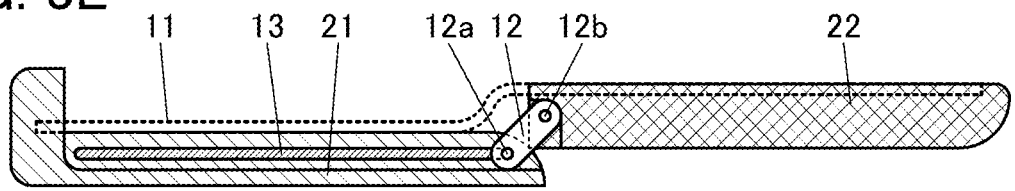
Figure 3F:
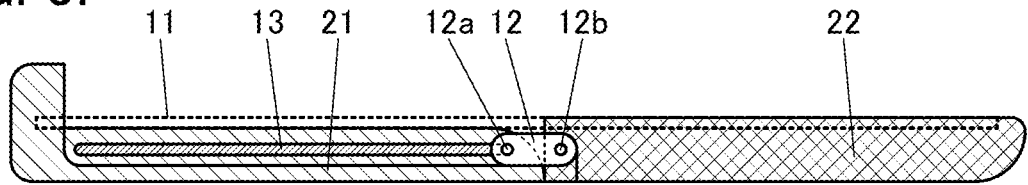

Next, slide operation will be described with reference to FIGS. 3B to 3F. FIG. 3B illustrates a state where the display panel 11 is folded. FIG. 3F illustrates a state where the display panel 11 is opened. FIGS. 3C to 3E illustrate states between the state of FIG. 3B and the state of FIG. 3F in stages. The electronic device 10 can be reversibly changed in shape between the state of FIG. 3B and the state of FIG. 3F. Here, in each of FIGS. 3B to 3F, a side surface of the display panel 11 is denoted by a dashed line to illustrate a shape of the display panel 11.

In the state of FIG. 3B, the hinge 12 is positioned at one end of the slide rail 13. When the housing 22 is pulled in a direction of an arrow, the hinge 12 is slid along the slide rail 13, and thus, the electronic device 10 is changed from the state of FIG. 3B to the state of FIG. 3D through the state of FIG. 3C. In the state of FIG. 3D, the hinge 12 is positioned at the other end of the slide rail 13.

When the housing 22 is slid, the portion 11a (the reference numeral is not illustrated) of the display panel 11 that is fixed to the housing 21 and the portion 11b (the reference numeral is not illustrated) of the display panel 11 that is fixed to the housing 22 are slid while maintaining their display surfaces parallel to each other. In the flexible portion 11c (the reference numeral is not illustrated) of the display panel 11, the position of the portion where the display surface is concavely curved moves in a direction apart from the portion 11a. That is, the display panel 11 is changed in shape so that the position of the curved portion is changed in the flexible portion 11c. At this time, when the position of the portion where the display surface is convexly curved of the portion 11c is not changed, the amount of change in the position of the portion where the display surface is concavely curved is about half of the slide amount of the housing 22.

When the housing 22 is further pulled in the direction of the arrow in the state of FIG. 3D, the hinge 12 rotates on the shaft 12a and the shaft 12b as illustrated in FIG. 3E. At this time, the hinge 12 rotates so that the angle at which the hinge 12 rotates on one shaft and the angle at which the hinge 12 rotates on the other shaft are the same. Thus, the housing 21 and the housing 22 relatively move while parts of the display panel 11 which are fixed to the housing 21 and the housing 22 maintain the state where the display surfaces are parallel to each other. After that, through the state of FIG. 3E, the housing 21 and the housing 22 move until the flexible portion 11c of the display panel 11 becomes flat as illustrated in FIG. 3F.

In the state of FIG. 3F, the display panel 11 is spread and flat. At this time, the display surfaces of the portion 11a, the portion 11b, and the portion 11c of the display panel 11 are preferably positioned on the same plane.

The electronic device 10 is changed in shape from the state of FIG. 3F to the state of FIG. 3B in reverse order of the above-described method. For example, when the hinge 12 is rotated by applying force to the housing 22 in an obliquely above direction, the electronic device 10 can be changed from the state of FIG. 3F to the state of FIG. 3D through the state of FIG. 3E. After that, when the housing 22 is slid so as to be pushed, the electronic device 10 can be changed to the state of FIG. 3B through the state of FIG. 3C.

In the state of FIG. 3D, part of the flexible portion 11c of the display panel 11 is curved along the surface of the projection of the housing 22. In addition, when the housing 22 is slid so as to be pushed from the state of FIG. 3D, the display panel 11 is changed in shape so that the position of the portion where the display surface is concavely curved is changed while a portion in contact with the projection maintains its shape.

Here, a cross-sectional shape of an end portion of the housing 21 that is positioned on the housing 22 side when the display panel 11 is opened is an arc shape. In that case, the hinge 12 can be rotated in the state where the housing 21 and the housing 22 do not physically interfere (are not in contact) with each other as illustrated in FIG. 3E. Note that the cross-sectional shapes of the housing 21 and the housing 22 are examples and are not limited to these examples.

Figure 4A:
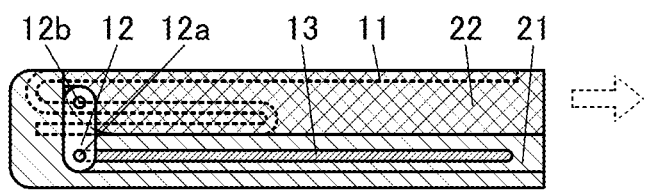
FIGS. 4A to 4E illustrate structural examples of an electronic device of an embodiment.
Figure 4B:
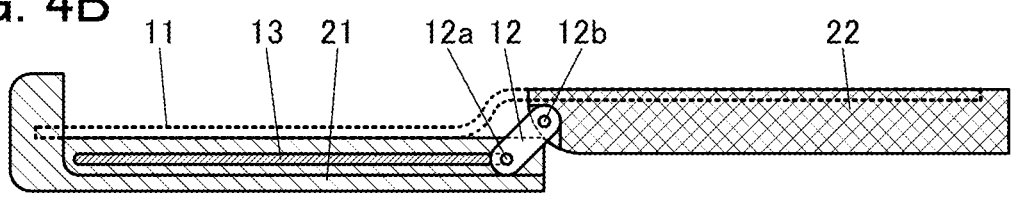
Figure 4C:
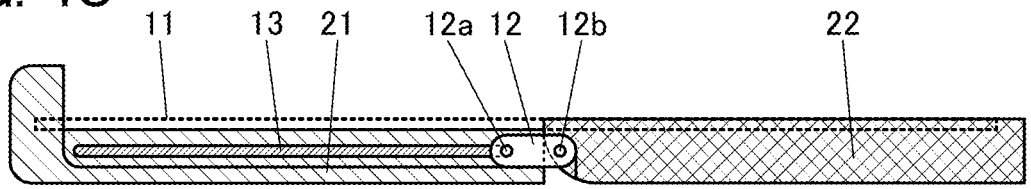
Figure 4D:
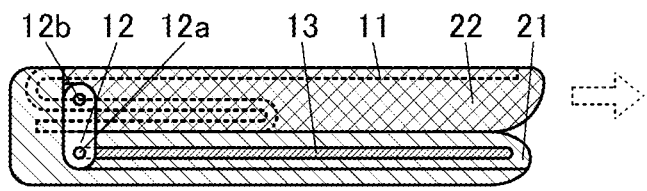
Figure 4E:
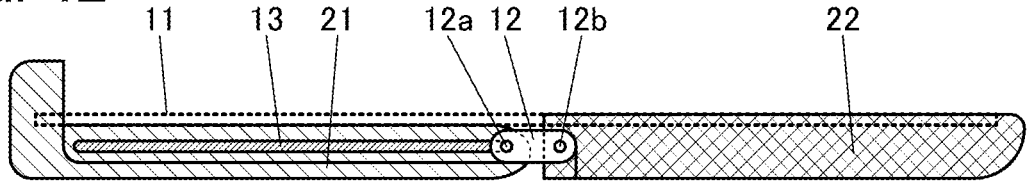

FIGS. 4A to 4C illustrate an example in which a shape of an end portion of the housing 22 is an arc shape. FIGS. 4D and 4E illustrate an example in which an end portion of the housing 21 on its bottom side also has an arc shape.

FIGS. 5A to 5E illustrate an example in which the slide rail 13 is provided on the housing 22.

A depression functioning as the slide rail 13 is provided on the side surface of the housing 22. The shaft 12b of the hinge 12 fits in the depression of the slide rail 13 and can be slid along the slide rail 13. The housing 21 and the hinge 12 are attached to each other so as to be rotatable on the shaft 12a.

Figure 5A:
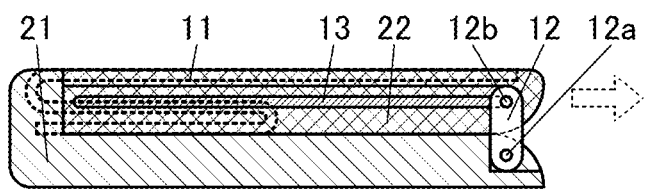
FIGS. 5A to 5E illustrate a structural example of an electronic device of an embodiment.
Figure 5B:
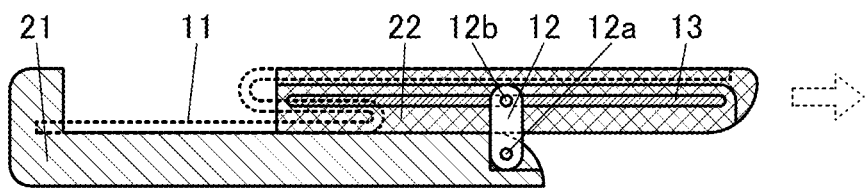
Figure 5C:
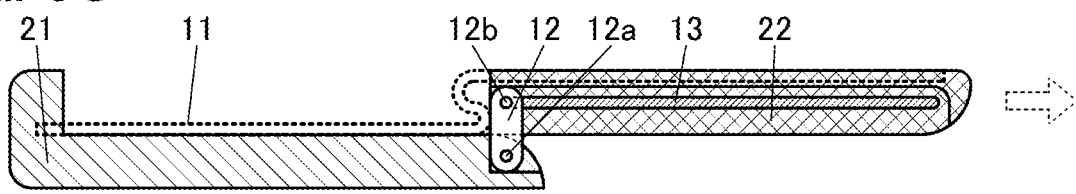
Figure 5D:
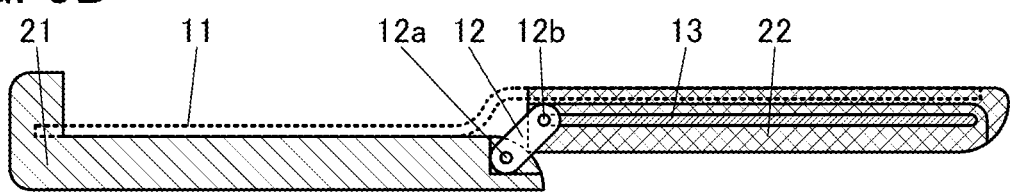
Figure 5E:
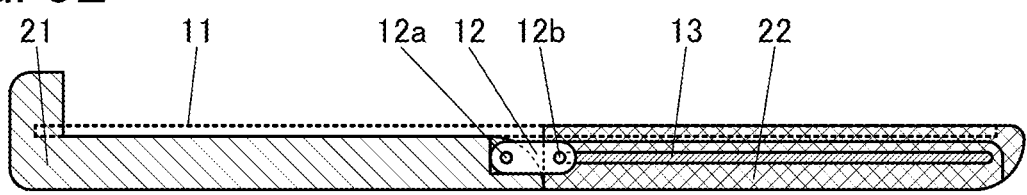

In the state of FIG. 5A, the hinge 12 is positioned at one end of the slide rail 13. When the housing 22 is pulled, the housing 22 is slid using the hinge 12, whereby the electronic device 10 is changed from the state of FIG. 5A to the state of FIG. 5C through the state of FIG. 5B. The hinge 12 rotates when the housing 22 is further pulled, and thus, the electronic device 10 is changed to the state of FIG. 5E through the state of FIG. 5D. Note that the electronic device 10 is changed in shape from the state of FIG. 5E to the state of FIG. 5A in reverse order of the above-described method.

In the above, the electronic device in which the display panel 11 can be folded in three is described; however, when the display panel 11 is folded in more than three, an electronic device with higher portability can be provided.

Figure 6A:
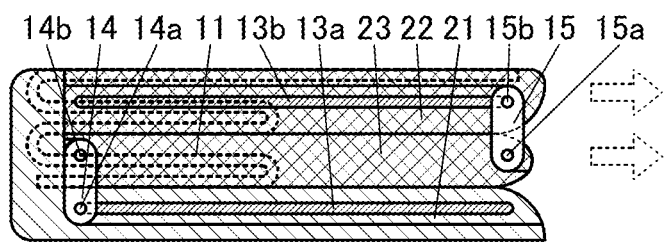
FIGS. 6A and 6B illustrate a structural example of an electronic device of an embodiment.
Figure 6B:
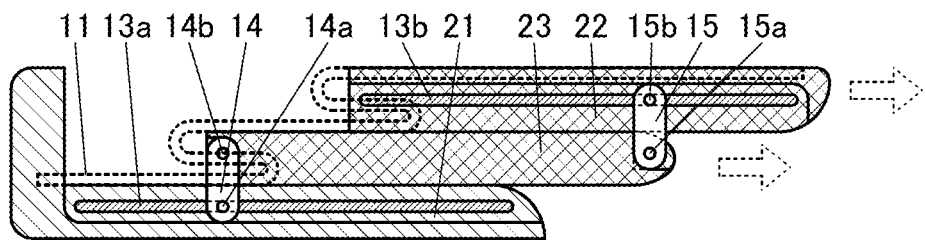

FIGS. 6A and 6B illustrate an example of an electronic device that can be folded in five. The electronic device includes a housing 23 between the housing 21 and the housing 22. The electronic device also includes a hinge 14 connecting the housing 21 to the housing 23 and a hinge 15 connecting the housing 23 to the housing 22. The housing 21 and the housing 22 include a slide rail 13a and a slide rail 13b, respectively. A shaft 14a of the hinge 14 fits in a depression of the slide rail 13a of the housing 21 and can be slid along the slide rail 13a. A shaft 15b of the hinge 15 fits in a depression of the slide rail 13b of the housing 22 and can be slid along the slide rail 13b. The hinge 14 and the hinge 15 are attached to the housing 23 so as to be rotatable on a shaft 14b and a shaft 15a, respectively.

As illustrated in FIGS. 6A and 6B, when the housing 23 and the housing 22 are slid in directions of arrows, the electronic device can be changed in shape between a state where the display panel 11 is folded in five and a state where the display panel 11 is opened.

Note that although a structure in which the display panel 11 can be folded in five is described here, one embodiment of the present invention is not limited thereto, and the number of folding operations of the display panel 11 can be increased when the number of housings is increased. When an aspect ratio (a ratio of a long side to a short side in a rectangle) of the display panel 11 in the opened state is high (e.g., 16:9 or higher, preferably 2:1 or higher), it is preferable that the display panel 11 be capable of being folded in five or more because the portability of the electronic device in the state where the display panel 11 is folded is improved. At this time, it is preferable that the length of the display panel 11 in the opened state be sufficiently larger than (e.g., two times or more, preferably three times or more as large as) the thickness of the electronic device in which the housings overlap with each other.

Note that although an example in which a mechanism for sliding the housing 21 and the housing 22 includes the slide rail 13 and the hinge 12 is described here, one embodiment of the present invention is not limited thereto, and another structure can be employed. For example, a slide rail that is provided so that the housing 22 is slid in an L-like shape with respect to the housing 21 may be used, in which case a hinge is not necessarily provided.

The above is the description of the slide mechanism.

Lock Mechanism

The electronic device 10 preferably includes a lock mechanism capable of fixing the relative positions of the housing 21 and the housing 22 in each of the state where the display panel 11 is folded (e.g., FIG. 1A1) and the state where the display panel 11 is opened (e.g., FIG. 1C1). For example, the above-mentioned slide mechanism preferably includes a mechanism capable of locking the relative positions of the housing 21 and the housing 22 at two or more stable positions and releasing the lock relatively easily.

FIGS. 7A1 and 7A2 are enlarged views of part of the housing 21 provided with a mechanism for locking the position of the shaft 12a of the hinge 12. The slide mechanism includes a leaf spring 51 attached to the housing 21 and a screw 52. The leaf spring 51 includes a projection that is provided to protrude to a path of the shaft 12a in the slide rail 13.

As illustrated in FIG. 7A1, the leaf spring 51 is curved when the projection of the leaf spring 51 is in contact with the shaft 12a. When the shaft 12a reaches an end portion of the slide rail 13, the projection of the leaf spring 51 holds part of a surface of the shaft 12a. Accordingly, as illustrated in FIG. 7A2, the shaft 12a is fixed to the end portion of the slide rail 13 as the stable position. When force is applied in a direction in which the shaft 12a is apart from the end portion of the slide rail 13, the leaf spring 51 is lifted and the shaft 12a can be slid in a direction apart from the stable position.

As illustrated in FIGS. 7B1 and 7B2, a spring portion 53 in which part of the housing 21 is processed so as to be able to change its shape into a spring-like shape can be used, in which case the leaf spring 51 and the screw 52 are not necessarily used.

FIGS. 8A1 and 8A2 illustrate an example in which a mechanism for locking both the position and the angle of the hinge 12 is provided on the other end of the slide rail 13 of the housing 21.

A notch 54 is provided in the shaft 12a. When the shaft 12a rotates from the state of FIG. 8A1, the projection of the leaf spring 51 fits in the notch 54 as illustrated in FIG. 8A2. Accordingly, the position and the rotation angle of the shaft 12a are fixed to the end portion of the slide rail 13 as the stable position. When the shaft 12a rotates from the state of FIG. 8A2, the leaf spring 51 is lifted and the shaft 12a can be slid in a direction apart from the stable position.

FIG. 8B illustrates an example in which the spring portion 53 is provided instead of the leaf spring 51 and the screw 52.

Although an example in which the lock mechanism is provided in the housing 21 is described here, the same structure can be used in the housing 22 when the slide rail 13 is provided on the housing 22 as illustrated in FIG. 5A and the like.

A lock mechanism for locking the rotation of the hinge 12 is preferably included in the housing on which the slide rail 13 is not provided. FIG. 8C illustrates an example in which a lock mechanism capable of locking only the rotation angle of the shaft 12b at the stable position is provided in the housing 22. The shaft 12b includes two notches 54 apart from each other at an angle of 90°. Accordingly, the hinge 12 can be locked at two stable positions. The number of notches 54 is not limited to two, and may be one, or three or more. When the slide rail 13 is provided on the housing 22 as illustrated in FIG. 5A and the like, the same structure can be used in the housing 21.

Although, in the above, an example of the lock mechanism for locking the position, the angle, or the position and the angle of the shaft of the hinge 12 is described, a variety of mechanisms can be used as long as they can lock the relative positions of the housing 21 and the housing 22. For example, a lock mechanism may be provided between a portion of the hinge 12 other than the shaft and the housing 21 or the housing 22, or between the housing 21 and the housing 22. Furthermore, the relative positions of the housing 21 and the housing 22 may be locked in the state where the display panel 11 is folded (e.g., FIG. 1A1) by providing a hook-like member for the housing 21 or the housing 22, for example. A button or a switch for releasing the lock may be provided in the housing 21 or the housing 22.

The above is the description of the lock mechanism.

Modification Example

Structural examples of the electronic device 10 whose structure is partly different from the above structures will be described below.

FIG. 9A is a schematic cross-sectional view of the electronic device 10 in the state where the display panel 11 is folded. In FIG. 9A, a portion positioned between two curved portions of the flexible portion 11c of the display panel 11 extends not in a direction parallel to the portion 11a and the portion 11b but in an oblique direction. Specifically, the portion where the display surface is convexly curved and the portion where the display surface is concavely curved of the portion 11c are each curved at an angle less than 180°. With such a structure, when the housing 21 and the housing 22 are slid so as to be closed, the direction of force which is applied when the portion 11c of the display panel 11 is pulled can be an obliquely above direction. Accordingly, the portion 11c can be changed in shape more easily than the case of FIG. 2A.

FIG. 9B illustrates an example in which the portion where the display surface is convexly curved and the portion where the display surface is concavely curved of the portion 11c of the display panel 11 are each curved at an angle more than 180°. With such a structure, the curvature radiuses of the two curved portions in the portion 11c can be larger than the case of FIG. 2A. Accordingly, stress applied to the curved portions of the portion 11c of the display panel 11 is reduced, so that an electronic device with high reliability can be provided. When the portion 11c is curved with the same curvature radius as the case of FIG. 2A, the thickness of the housing 22 can be reduced.

FIG. 9C1 illustrates an example in which the housing 21 and the housing 22 are curved. FIG. 9C2 is a schematic cross-sectional view in the state where the display panel 11 is spread.

The display panel 11 is curved along surface shapes of the housing 21 and the housing 22. When the display surface is concavely curved, a distance between the user's eyes and the display surface (also referred to as a viewing distance) at the central portion and that at the end portion in the display region can be close. Thus, a sense of immersion is enhanced and display in which the user can easily feel a sense of reality can be performed.

For example, even when the electronic device 10 is put in a trouser pocket, the user can move as usual because such a curved housing fits along the user's body.

Although, in FIGS. 9C1 and 9C2, the housing 21 and the housing 22 are curved so that the display surfaces have the concave shapes, the housing 21 and the housing 22 may be curved so that the display surfaces have the convex shapes. In the case of a wearable information terminal, such as a watch-type information terminal, the information terminal can be worn so that the housing 21 and the housing 22 fit along a curved surface of the body such as an arm, so that the user can comfortably wear the information terminal.

Figure 10A:
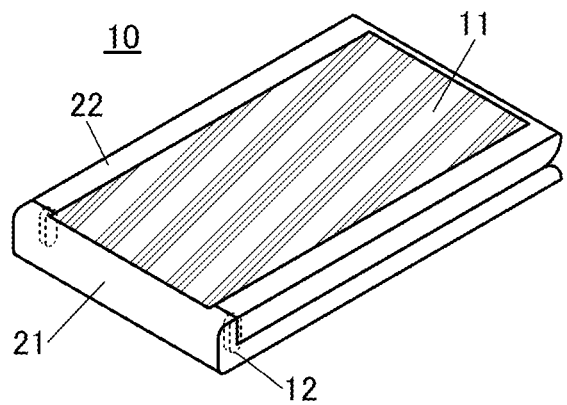
FIGS. 10A to 10C illustrate a structural example of an electronic device of an embodiment.
Figure 10B:
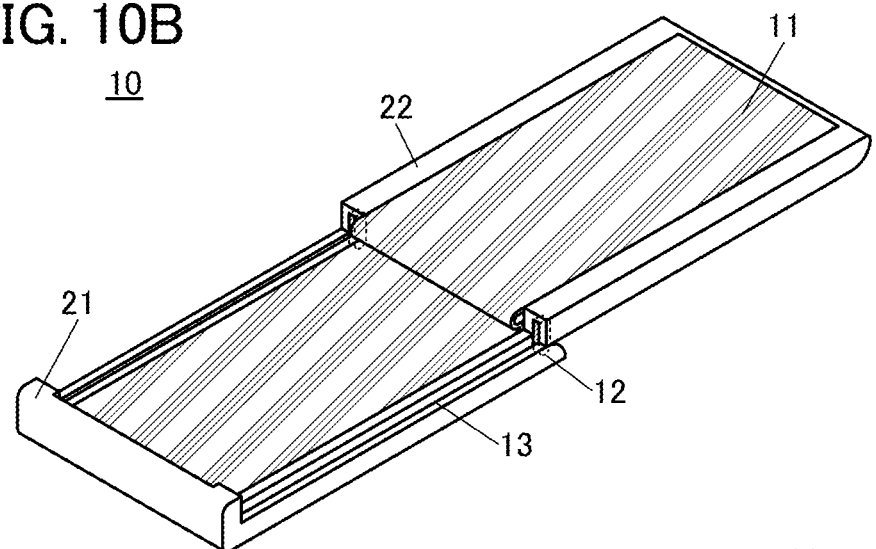
Figure 10C:
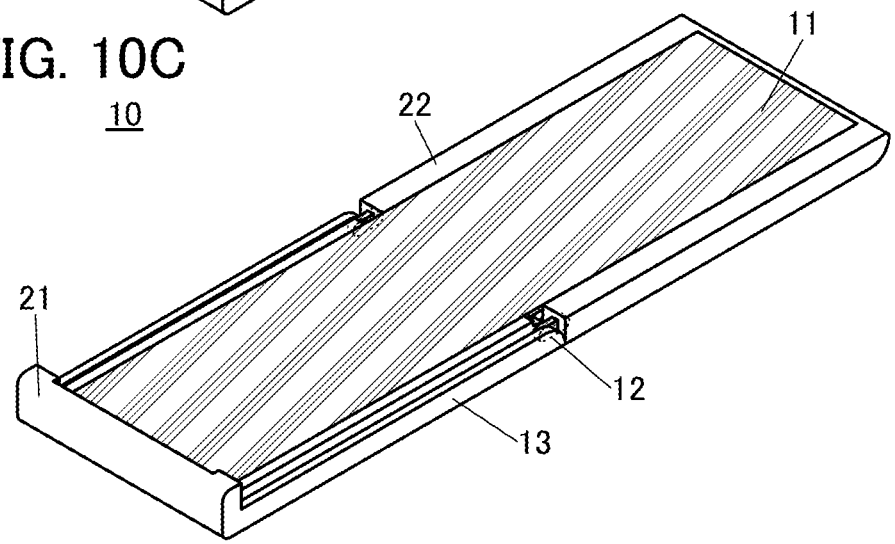

FIGS. 10A to 10C illustrate an example of the electronic device 10 in which the housing 22 is slid in the long-side direction of the housing 21. Here, display with a high aspect ratio can be performed in the state where the display panel 11 is opened as illustrated in FIG. 10C. For example, like windows associated with applications, a plurality of vertically long images and a plurality of horizontally long images can be arranged and displayed in the vertical direction and the horizontal direction, respectively. Thus, operations with a plurality of applications can be performed at the same time without changing a screen, resulting in improvement in convenience. Furthermore, when the long side of the display panel 11 is in a horizontal direction, a horizontally long image such as a movie or a panorama photograph can be displayed without reducing the size of the image. When the long side of the display panel 11 is in a vertical direction, a greater number of horizontally written sentences or the like than the conventional one can be displayed without reducing the size of characters.

The above is the description of the modification examples.

Structural Examples of Electronic Device

A structural example of hardware provided in each of the housings in the electronic device 10 will be described below.

Figure 11:
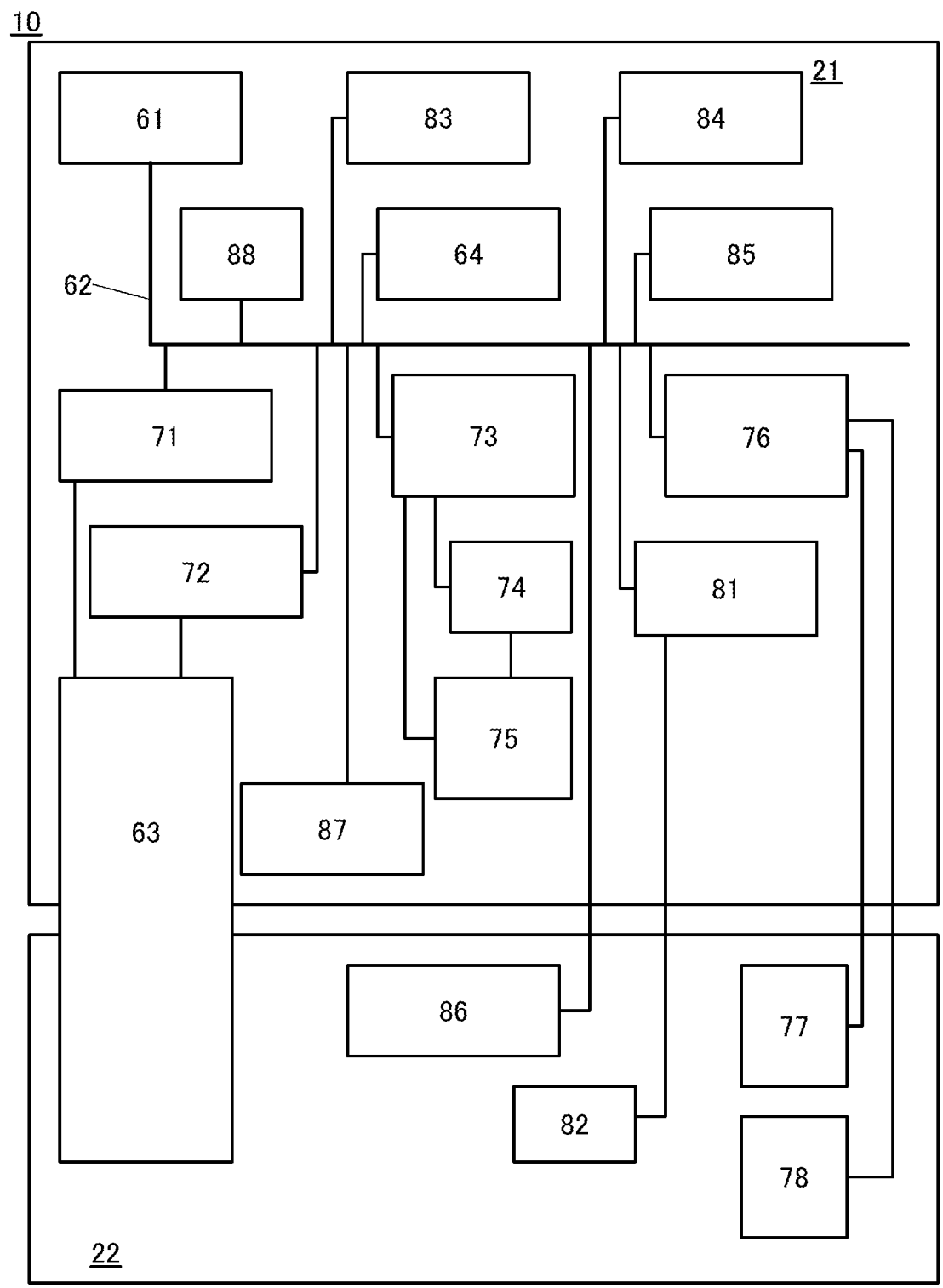
FIG. 11 is a block diagram of an electronic device of an embodiment.

FIG. 11 is a block diagram illustrating a structural example of the electronic device 10.

Although the block diagram attached to this specification shows components classified by their functions in independent blocks, it is difficult to classify actual components according to their functions completely and it is possible for one component to have a plurality of functions.

Note that the structure of the electronic device 10 illustrated in FIG. 11 is an example, and the electronic device 10 does not need to include all the components. The electronic device 10 includes necessary components among the components illustrated in FIG. 11 and may include a component other than the components in FIG. 11.

The electronic device 10 includes the housing 21, the housing 22, and a touch panel 63. The touch panel 63 lies across the housing 21 and the housing 22.

The housing 21 includes an arithmetic portion (CPU) 61, a memory device 64, a display controller 71, a touch sensor controller 72, a battery controller 73, a power receiving portion 74, a battery module 75, a sound controller 76, a communication module 81, a posture measurement portion 83, a shape measurement portion 84, an external interface 85, a vibration module 87, a sensor 88, and the like. The housing 22 includes an audio input portion 77, an audio output portion 78, an antenna 82, a camera module 86, and the like.

The memory device 64, the display controller 71, the touch sensor controller 72, the battery controller 73, the sound controller 76, the communication module 81, the posture measurement portion 83, the shape measurement portion 84, the external interface 85, the camera module 86, the vibration module 87, the sensor 88, and the like are connected to the arithmetic portion 61 via a bus line 62.

The touch panel 63 corresponds to the above-mentioned display panel 11. That is, the touch panel 63 includes the portion fixed to the housing 21, the portion fixed to the housing 22, and the flexible portion which is not fixed to any housing.

The arithmetic portion 61 can function as a central processing unit (CPU), and has a function of controlling components such as the memory device 64, the display controller 71, the touch sensor controller 72, the battery controller 73, the sound controller 76, the communication module 81, the posture measurement portion 83, the shape measurement portion 84, the external interface 85, the camera module 86, the vibration module 87, and the sensor 88.

Signals are transmitted between the arithmetic portion 61 and the components via the bus line 62. The arithmetic portion 61 has a function of processing signals input from the components which are connected to the arithmetic portion 61 via the bus line 62, a function of generating signals to be output to the components, and the like, so that the components connected to the bus line 62 can be controlled comprehensively.

Note that a transistor which includes an oxide semiconductor in a channel formation region and has an extremely low off-state current can be used in an IC included in the arithmetic portion 61 and the other components, and the like. With the use of the transistor having an extremely low off-state current as a switch for holding electric charge (data) which flows into a capacitor functioning as a memory element, a long data retention period can be ensured. By utilizing this characteristic for a register or a cache memory of the arithmetic portion 61, normally off computing is achieved where the arithmetic portion 61 operates only when needed and information on the previous processing is stored in the memory element in the rest of time; thus, power consumption of the electronic device 10 can be reduced.

The arithmetic portion 61 interprets and executes instructions from various programs with a processor to process various kinds of data and control programs. The programs executed by the processor may be stored in a memory region of the processor or in the memory device 64.

As an example of the arithmetic portion 61 other than the CPU, a microprocessor, such as a digital signal processor (DSP) or a graphics processing unit (GPU), can be used alone or in combination. Furthermore, such a microprocessor may be obtained with a programmable logic device (PLD) such as a field programmable gate array (FPGA) or a field programmable analog array (FPAA).

The arithmetic portion 61 may include a main memory. The main memory can include a volatile memory, such as a random access memory (RAM), and a nonvolatile memory, such as a read only memory (ROM).

For example, a dynamic random access memory (DRAM) is used for the RAM included in the main memory, in which case a memory space as a workspace for the arithmetic portion 61 is virtually allocated and used. An operating system, an application program, a program module, program data, and the like which are stored in the memory device 64 are loaded into the RAM and executed. The data, program, and program module which are loaded into the RAM are directly accessed and operated by the arithmetic portion 61. Moreover, characteristic data for calculating the position and the direction of the electronic device 10, the relative positional relationship between the housings, and the like from the data input from the posture measurement portion 83, the shape measurement portion 84, the sensor 88, and the like may be read out from the memory device 64 as a lookup table and stored in the main memory.

In the ROM, a basic input/output system (BIOS), firmware, and the like for which rewriting is not needed can be stored. As the ROM, a mask ROM, a one-time programmable read only memory (OTPROM), an erasable programmable read only memory (EPROM), or the like can be used. As an EPROM, an ultra-violet erasable programmable read only memory (UV-EPROM) which can erase stored data by irradiation with ultraviolet rays, an electrically erasable programmable read only memory (EEPROM), a flash memory, and the like can be given.

Examples of the memory device 64 are a memory device including a nonvolatile memory element, such as a flash memory, a magnetoresistive random access memory (MRAM), a phase change RAM (PRAM), a resistance RAM (ReRAM), or a ferroelectric RAM (FeRAM), and a memory device including a volatile memory element, such as a dynamic RAM (DRAM) or a static RAM (SRAM). Alternatively, a storage media drive such as a hard disk drive (HDD) or a solid state drive (SSD) may be used, for example.

As the memory device 64, a memory device which can be connected to and disconnected from the external interface 85 with a connector, such as an HDD or an SSD, or a storage media drive, such as a flash memory, a Blu-ray disc, or a DVD can be used. Note that the memory device 64 is not necessarily incorporated in the electronic device 10, and a memory device outside the electronic device 10 may be used as the memory device 64. In this case, the memory device may be connected through the external interface 85, or data transmission and reception may be wirelessly performed using the communication module 81.

The touch panel 63 is connected to the display controller 71 and the touch sensor controller 72. The display controller 71 and the touch sensor controller 72 are connected to the arithmetic portion 61 via the bus line 62.

The display controller 71 controls the touch panel 63 according to drawing instructions input from the arithmetic portion 61 via the bus line 62 so that a predetermined image is displayed on the display surface of the touch panel 63.

The touch sensor controller 72 controls a touch sensor of the touch panel 63 according to requests from the arithmetic portion 61 via the bus line 62. In addition, the touch sensor controller 72 outputs a signal received by the touch sensor to the arithmetic portion 61 via the bus line 62. Note that the function of calculating touch position information from a signal received by the touch sensor may be given to the touch sensor controller 72 or the arithmetic portion 61.

The touch panel 63 can display an image on the basis of a signal supplied from the display controller 71. In addition, the touch panel 63 is capable of sensing the proximity or touch of an object such as a finger or a stylus on the basis of a signal supplied from the touch sensor controller 72 and outputting the positional information of the object to the touch sensor controller 72.

The touch panel 63 and the touch sensor controller 72 preferably have a function of obtaining the distance between a sensing surface and the object in the height direction, a function of obtaining the magnitude of pressure applied to the sensing surface by the object, and a function of obtaining the size of the surface of the sensing surface that is in contact with the object.

In the touch panel 63, a module including a touch sensor is provided on the display surface side of the display panel so as to overlap with the display panel. At this time, at least part of the module including a touch sensor is preferably flexible to follow the bending of the display panel. The module including a touch sensor can be bonded to the display panel with an adhesive or the like. A polarizing plate or a cushion material (e.g., a separator) may be provided between the module and the display panel. The thickness of the module including a touch sensor is preferably smaller than or equal to that of the display panel.

A touch panel in which a display panel and a touch sensor are combined may be used as the touch panel 63. For example, the touch panel 63 is preferably an on-cell touch panel or an in-cell touch panel. The on-cell or in-cell touch panel has a small thickness and therefore can be lightweight. In addition, the number of components of the on-cell or in-cell touch panel can be reduced, so that cost can be reduced.

A variety of sensors capable of sensing the proximity or touch of an object such as a finger can be used as the touch sensor included in the touch panel 63. For example, a sensor of a capacitive type, a resistive type, a surface acoustic wave type, an infrared type, or an optical type can be used. In addition, an optical sensor using a photoelectric conversion element, a pressure-sensitive sensor using a pressure-sensitive element, or the like may be used. Two or more sensors of different types may be used, or two or more sensors of the same type may be used.

For example, a capacitive touch sensor includes a pair of conductive layers. Capacitive coupling is generated in the pair of conductive layers. The capacitance of the pair of conductive layers changes when an object touches or gets close to the pair of conductive layers. Utilizing this effect, sensing can be conducted.

Examples of the capacitive touch sensor are a surface capacitive touch sensor and a projected capacitive touch sensor. Examples of the projected capacitive touch sensor are a self-capacitive touch sensor and a mutual capacitive touch sensor, which differ mainly in the driving method. The use of the mutual capacitive touch sensor is preferable because simultaneous sensing of multiple points can be performed easily.

Instead of the touch panel 63, a display panel which does not have a function as a touch sensor may be used. Even in that case, the browsability of display can be improved when the display panel is spread.

For example, a flexible substrate is used as a substrate supporting a display element, a circuit for driving the display element, a circuit included in a touch sensor, and the like, whereby the flexible touch panel 63, display panel, touch sensor, and the like can be obtained.

A typical example of a material of a flexible substrate is an organic resin. In addition, glass, metal, alloy, a semiconductor, or the like that is thin enough to have flexibility, or a composite material or a stacked material containing two or more of an organic resin, glass, metal, alloy, a semiconductor, and the like can be used.

As the display element included in the touch panel 63, a self-luminous light-emitting element such as an organic light-emitting diode (OLED), a light-emitting diode (LED), or a quantum-dot light-emitting diode (QLED) can be used. Alternatively, a transmissive, reflective, or semi-transmissive liquid crystal element may be used. Besides, for example, a display element such as a micro electro mechanical systems (MEMS) element or an electron-emissive element can be used in the display device. Examples of MEMS display elements are a MEMS shutter display element and an optical interference type MEMS display element. A carbon nanotube may be used for the electron-emissive element. Alternatively, electronic paper may be used. As the electronic paper, an element using a microcapsule method, an electrophoretic method, an electrowetting method, an Electronic Liquid Powder (registered trademark) method, or the like can be used.

The battery controller 73 can manage a charge state of the battery module 75. In addition, the battery controller 73 supplies power from the battery module 75 to the components. The power receiving portion 74 has a function of receiving power supplied from the outside and charging the battery module 75. The battery controller 73 can control the operation of the power receiving portion 74 depending on the charge state of the battery module 75.

The battery module 75 includes one or more primary batteries or secondary batteries, for example Examples of the secondary battery which can be used for the battery module 75 include a lithium ion secondary battery and a lithium ion polymer secondary battery. In addition to such a battery, a protection circuit for preventing overcharge, overdischarge, and the like of the battery may be provided in the battery module 75.

In the case of indoor use or the like, an alternating-current (AC) power supply may be used as an external power supply. Particularly in the case of using the electronic device 10 separately from the external power supply, it is favorable that the battery module 75 have a large charge/discharge capacity which allows the electronic device 10 to be used for a long time. The battery module 75 may be charged using a battery charger capable of supplying power to the electronic device 10. At this time, charging may be performed through wires using a USB connector, an AC adaptor, or the like; alternatively, charging may be performed by a wireless power feeding method such as an electric field coupling method, an electromagnetic induction method, or an electromagnetic resonance (electromagnetic resonant coupling) method.

The battery controller 73 may include a battery management unit (BMU), for example. The BMU collects data on cell voltage or cell temperatures of the battery, monitors overcharge and overdischarge, controls a cell balancer, handles a deterioration state of the battery, calculates the remaining battery power level (state of charge: SOC), and controls detection of a failure, for example.

The battery controller 73 controls power transmission from the battery module 75 to the components through the bus line 62 or a power supply line. The battery controller 73 can include a power converter with a plurality of channels, an inverter, a protection circuit, and the like.

The battery module 75 preferably overlaps with the touch panel 63. When a housing (here, the housing 21) incorporating the battery module 75 is flexible and can be used in a bent state, it is preferable that at least part of the battery module 75 be also flexible. Examples of the secondary battery which can be used for the battery module 75 include a lithium ion secondary battery and a lithium ion polymer secondary battery. It is preferable that a laminate pouch be used as an external package of the battery so that the battery has flexibility.

A film used for the laminate pouch is a single-layer film selected from a metal film (e.g., an aluminum film, a stainless steel film, and a nickel steel film), a plastic film made of an organic material, a hybrid material film containing an organic material (e.g., an organic resin or fiber) and an inorganic material (e.g., ceramic), and a carbon-containing inorganic film (e.g., a carbon film or a graphite film), or a stacked-layer film including two or more of the above films. A metal film can be easily embossed. Forming depressions or projections by embossing increases the surface area of the film exposed to outside air, achieving efficient heat dissipation.

It is particularly preferable that a laminate pouch including a metal film having depressions and projections by embossing be used, in which case a strain caused by stress applied to the laminate pouch can be relieved, leading to an effective decrease of defects such as a break of the laminate pouch due to bending of a secondary battery.

In addition, the battery controller 73 preferably has a function of reducing power consumption. For example, after detection of no input to the electronic device 10 for a given period, the battery controller 73 lowers clock frequency or stops input of clocks of the arithmetic portion 61, stops operation of the arithmetic portion 61 itself, stops operation of the auxiliary memory, or reduces power supplied to the components in order to reduce power consumption. Such a function is performed with the battery controller 73 alone or the battery controller 73 interlocking with the arithmetic portion 61.

The audio input portion 77 includes a microphone, an audio input connector, or the like. The audio output portion 78 includes a speaker, an audio output connector, or the like. The audio input portion 77 and the audio output portion 78 are connected to the sound controller 76, and are connected to the arithmetic portion 61 via the bus line 62. Audio data input to the audio input portion 77 is converted into a digital signal in the sound controller 76 and then processed in the sound controller 76 and the arithmetic portion 61. The sound controller 76 generates an analog audio signal audible to a user according to instructions from the arithmetic portion 61 and outputs the analog audio signal to the audio output portion 78. To the audio output connector of the audio output portion 78, an audio output device such as earphones, headphones, or a headset can be connected and a sound generated in the sound controller 76 is output to the device.

The communication module 81 can communicate via the antenna 82. For example, the communication module 81 controls a control signal for connecting the electronic device 10 to a computer network according to instructions from the arithmetic portion 61 and transmits the signal to the computer network. Accordingly, communication can be performed by connecting the electronic device 10 to a computer network such as the Internet, which is an infrastructure of the World Wide Web (WWW), an intranet, an extranet, a personal area network (PAN), a local area network (LAN), a campus area network (CAN), a metropolitan area network (MAN), a wide area network (WAN), or a global area network (GAN). When a plurality of communication methods are used, the electronic device 10 may have a plurality of antennas 82 for the communication methods.

For example, a high frequency circuit (RF circuit) is included in the communication module 81 for receiving and transmitting an RF signal. The RF circuit performs conversion between an electromagnetic signal and an electric signal in a frequency band which is set by a national law, and performs communication with another communication device wirelessly with the use of the electromagnetic signal. Several tens of kilohertz to several tens of gigahertz are a practical frequency band which is generally used. The RF circuit connected to the antenna 82 includes an RF circuit portion compatible with a plurality of frequency bands. The RF circuit portion can include an amplifier, a mixer, a filter, a DSP, an RF transceiver, or the like. The following communication protocol or communication technology for wireless communication can be used: a communications standard such as Long Term Evolution (LTE), Global System for Mobile Communication (GSM) (registered trademark), Enhanced Data Rates for GSM Evolution (EDGE), Code Division Multiple Access 2000 (CDMA2000), or Wideband Code Division Multiple Access (W-CDMA) (registered trademark), or a communications standard developed by IEEE such as Wireless Fidelity (Wi-Fi) (registered trademark), Bluetooth (registered trademark), or ZigBee (registered trademark).

The communication module 81 may have a function of connecting the electronic device 10 to a telephone line. In the case of a telephone call through the telephone line, the communication module 81 controls a connection signal for connecting the electronic device 10 to the telephone line according to instructions from the arithmetic portion 61 and transmits the signal to the telephone line.

The communication module 81 may include a tuner generating an image signal from airwaves received by the antenna 82. The image signal is output to the touch panel 63. The tuner can include a demodulation circuit, an analog-digital (AD) converter circuit, a decoder circuit, and the like. The demodulation circuit has a function of demodulating a signal received by the antenna 82. The AD converter circuit has a function of converting the demodulated analog signal into a digital signal. The decoder circuit has a function of decoding image data contained in the digital signal and generating a signal to be transmitted to the display controller 71.

Alternatively, a decoder may include a dividing circuit and a plurality of processors. The dividing circuit has a function of dividing the input image data spatiotemporally and outputting it to the processors. The plurality of processors decode the input image data and generate signals to be transmitted to the display controller 71. Since the decoder includes the plurality of processors which perform parallel data processing, image data containing enormous amounts of information can be decoded. Particularly in the case of displaying an image with resolution higher than the full high definition, a decoder circuit capable of decoding compressed data preferably includes a processor having extremely high-speed processing capability. The decoder circuit preferably includes a plurality of processors capable of performing 4 or more, preferably 8 or more, further preferably 16 or more parallel operations. The decoder may include a circuit for classifying an image signal contained in the input signal from other signals (e.g., text information, broadcast program information, and certification information).

The antenna 82 can receive airwaves such as a ground wave and a satellite wave. The antenna 82 can receive airwaves for analog broadcasting, digital broadcasting, and the like, and image-sound-only broadcasting, sound-only broadcasting, and the like. For example, the antenna 82 can receive airwaves transmitted in a certain frequency band, such as a UHF band (about 300 MHz to 3 GHz) or a VHF band (30 MHz to 300 MHz). When a plurality of pieces of data received in a plurality of frequency bands is used, the transfer rate can be increased, and thus, more information can be obtained. Accordingly, the touch panel 63 can display an image with resolution higher than the full high definition, such as 4K-2K, 8K-4K, 16K-8K, or higher.

Alternatively, the tuner may generate a signal using the broadcasting data transmitted with data transmission technology through a computer network. The signal is transmitted to the display controller 71. In the case where the tuner receives a digital signal, the tuner does not necessarily include the demodulation circuit and the AD converter circuit.

The posture measurement portion 83 has a function of measuring a tilt, a posture, and the like of the electronic device 10. For example, an acceleration sensor, an angular velocity sensor, a vibration sensor, a pressure sensor, a gyroscope sensor, or the like can be used for the posture measurement portion 83. Alternatively, these sensors may be used in combination.

The shape measurement portion 84 has a function of measuring the relative positional relationship between the housing 21 and the housing 22 and outputting the information to the arithmetic portion 61 via the bus line 62.

As the shape measurement portion 84, for example, a sensor similar to that in the posture measurement portion 83 can be provided in the housing 22. When information on the tilt or the posture of the housing 22 that is obtained in the shape measurement portion 84 is input to the arithmetic portion 61 through the bus line 62, the arithmetic portion 61 can calculate the relative positional relationship between the housing 21 and the housing 22 from the information on the tilt or the posture of the housing 21 measured by the posture measurement portion 83 and the information on the tilt or the posture of the housing 22.

Alternatively, the shape measurement portion 84 may measure the rotation angle of the hinge 12 described in the above structural example so that the relative positions of the two housings connected by the hinge 12 is measured. A rotation angle of the hinge on each rotation axis can be measured mechanically, optically, magnetically, or electrically.

Alternatively, a sensor for measuring the curved shape of a flexible member connecting the two adjacent housings can be used as the shape measurement portion 84. The touch panel 63, a protection member for protecting the touch panel 63, or the like may be used as the flexible member. As the sensor for measuring the curved shape, a plurality of acceleration sensors provided for, for example, the flexible member may be used so that the arithmetic portion 61 can calculate the shape of the flexible member on the basis of a change in acceleration at a position of each of the sensors. Alternatively, a sensor including a piezoelectric element provided for the flexible member may be used so that bending can be measured. Alternatively, a sensor whose physical characteristics, such as resistivity, thermal conductivity, and transmissivity, change due to the curving may be incorporated in the flexible member so that the shape can be calculated from the change of the physical characteristics.

The shape measurement portion 84 may have a function of measuring two states, a state where the two housings are closed and a state where they are opened. As an example of an optical measurement, a light-receiving element may be provided on one of the two adjacent housings, and blocking of external light when they are closed may be utilized for measurement. Alternatively, a light-receiving element may be provided on the surface of one of the two adjacent housings, a light source may be provided on the surface of the other, and incidence or no incidence of light from the light source on the light-receiving element when they are closed or opened may be utilized for measurement. It is preferable to use infrared light as light from the light source because users cannot visually recognize it.

Note that the structure of the shape measurement portion 84 is not limited to the above and any of a variety of sensors to which a mechanical, electromagnetical, thermal, acoustic, or chemical means is applied can be used as long as the sensor can measure the relative positional relationship between the two adjacent housings.

Examples of the external interface 85 include one or more buttons or switches (also referred to as housing switches) and an external port to which another input component can be connected which are provided on the housing 21 or the housing 22. The external interface 85 is connected to the arithmetic portion 61 via the bus line 62. Examples of the housing switches include a switch associated with powering on/off, a button for adjusting volume, and a camera button.

The external port of the external interface 85 can be connected to an external device such as a computer or a printer through a cable. A universal serial bus (USB) terminal is a typical example. As the external port, a local area network (LAN) connection terminal, a digital broadcasting reception terminal, an AC adaptor connection terminal, or the like may be provided. A transceiver for optical communication, without limitation to wire communication, using infrared rays, visible light, ultraviolet rays, or the like, may be provided.

The camera module 86 is connected to the arithmetic portion 61 via the bus line 62. The camera module 86 can take a still image or a moving image in synchronization with pushing a switch provided on the housing or touching the touch panel 63. The camera module 86 may include a light source for taking images. For example, a lamp such as a xenon lamp, and a light-emitting element such as an LED or an organic EL element can be used. Alternatively, the touch panel 63 may be used as the light source for taking images, in which case light with a variety of colors in addition to white may be used for taking images.

The vibration module 87 includes a vibrating element for vibrating the electronic device 10 and a vibration controller for controlling the vibrating element. As the vibrating element, an element capable of converting an electric signal or a magnetic signal into vibration, such as a vibration motor (eccentric motor), a resonant actuator, a magnetostrictive element, or a piezoelectric element can be used.

The vibration module 87 can vibrate the electronic device 10 with a variety of vibration patterns by controlling the number of vibrations, the amplitude, vibration time, and the like of the vibrating element according to instructions from the arithmetic portion 61. The vibration module 87 can generate vibration with a variety of vibration patterns based on operation executed by a variety of applications. Examples of such vibration include vibration linked with operation of the housing switch or the like, vibration linked with startup of the electronic device 10, vibration linked with a moving image or audio reproduced by an application for reproducing a moving image, vibration linked with reception of an e-mail, and vibration linked with input operation to the touch panel 63.

The vibration module 87 preferably includes a plurality of vibrating elements. When vibrations of two or more vibrating elements are combined, a variety of vibration patterns can be generated, so that a user can receive a variety of information. For example, when the number of vibrations, the amplitude, the vibration patterns, timing, and the like of each vibrating element are controlled, more various vibrations can be generated as compared with the case of using one vibrating element. When a plurality of vibrating elements is provided, the same vibrating elements may be provided apart from each other or plural kinds of vibrating elements with different natural frequencies may be used.

The vibration module 87 preferably has a function of driving the electronic device 10 to be vibrated so that the degree of vibration differs depending on the positions of the surface of the housing by interference of vibrations (acoustic waves) from two or more vibrating elements provided apart from each other at the surface of the electronic device 10. At this time, an elastic body that can transmit the acoustic wave is preferably used in at least part of the surface of the electronic device 10. Thus, a novel tactile feedback can be provided to a user. Since the degree of vibration can be made different between positions, a user can feel the uneven shape or difference in friction resistance when the user touches the electronic device 10. Accordingly, for example, a texture of the displayed image can be represented in synchronization with the image displayed on the touch panel 63. In addition, when the uneven shape such as characters or braille is displayed on the surface of the electronic device 10, a user can obtain character information by touching the surface.

Figure 12A:
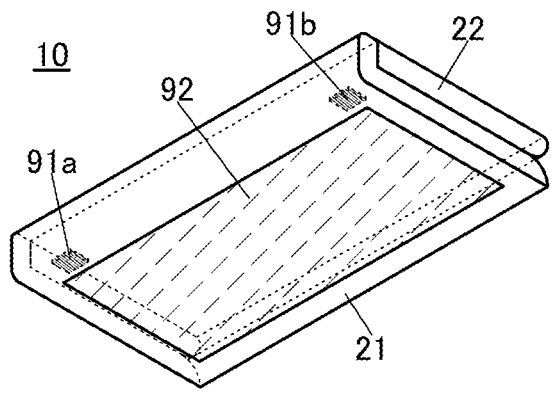
FIGS. 12A to 12C illustrate structural examples of an electronic device of an embodiment.
Figure 12B:
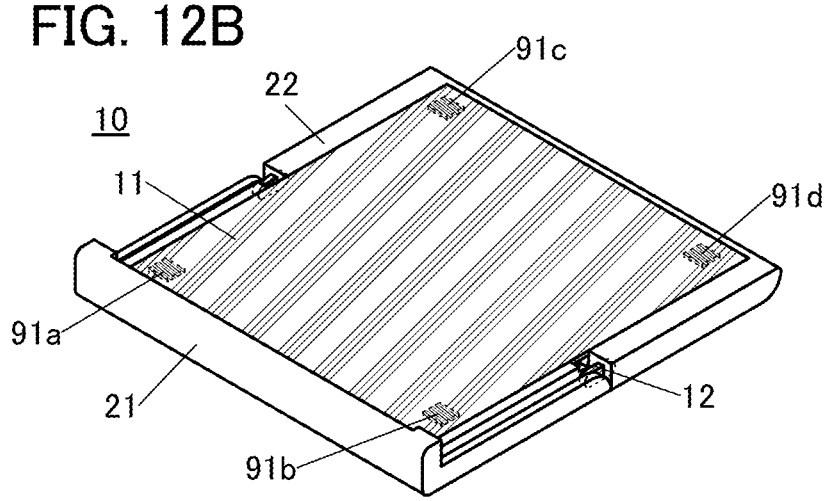

For example, FIG. 12A illustrates an example in which two vibrating elements (a vibrating element 91$a$ and a vibrating element 91$b$) are provided in the housing 21 of the electronic device 10 and a sheet-like elastic body 92 is provided on the surface of the housing 21 that is opposite to the display surface. The elastic body 92 preferably has a function as a touch sensor. FIG. 12B illustrates an example in which the two vibrating elements (the vibrating element 91$a$ and the vibrating element 91$b$) are provided in the housing 21 and two vibrating elements (a vibrating element 91$c$ and a vibrating element 91$d$) are provided in the housing 22. When the whole display panel 11 has flexibility, the display panel 11 can function as the above-mentioned elastic body.

Figure 12C:
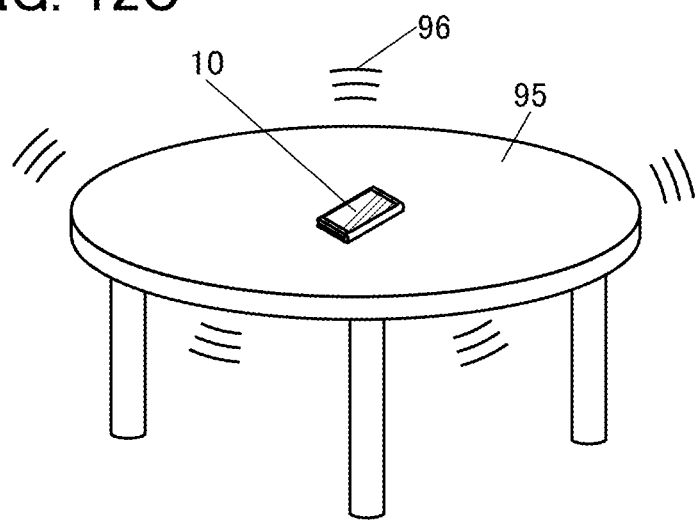

The electronic device 10 may have a function as a vibration generating body generating sound from an object when the electronic device 10 in a state of being vibrated by the vibration module 87 is made contact to a variety of objects to which vibration is transmitted, such as a table and a wall. When the electronic device 10 is linked with an application for reproducing music and vibrated in accordance with music being reproduced, an object in contact with the electronic device 10 can be used as a speaker. For example, FIG. 12C illustrates an example in which audio 96 is generated from a table 95 by the vibration of the electronic device 10 placed on the table 95.

The sensor 88 includes a sensor and a sensor controller. The sensor controller supplies electric power from the battery module 75 or the like to a sensor unit. Moreover, the sensor controller converts the input from the sensor unit into a control signal and outputs it to the arithmetic portion 61 via the bus line 62. The sensor controller may handle errors made by the sensor unit or may calibrate the sensor unit. Note that the sensor controller may include a plurality of controllers which control the sensor unit.

The sensor 88 may include any of a variety of sensors which measure force, displacement, position, speed, acceleration, angular velocity, rotational frequency, distance, light, liquid, magnetism, temperature, a chemical substance, a sound, time, hardness, electric field, current, voltage, electric power, radiation, flow rate, humidity, gradient, oscillation, smell, and infrared rays.

Each of the housing 21 and the housing 22 preferably includes the battery module. Thus, the charging frequency of the electronic device 10 can be reduced. When the battery modules are separately provided in the housing 21 and the housing 22, the thickness of the housing 21 can be reduced and the thicknesses of the two housings can be the same, so that the electronic device 10 can have a simple design.

Figure 13:
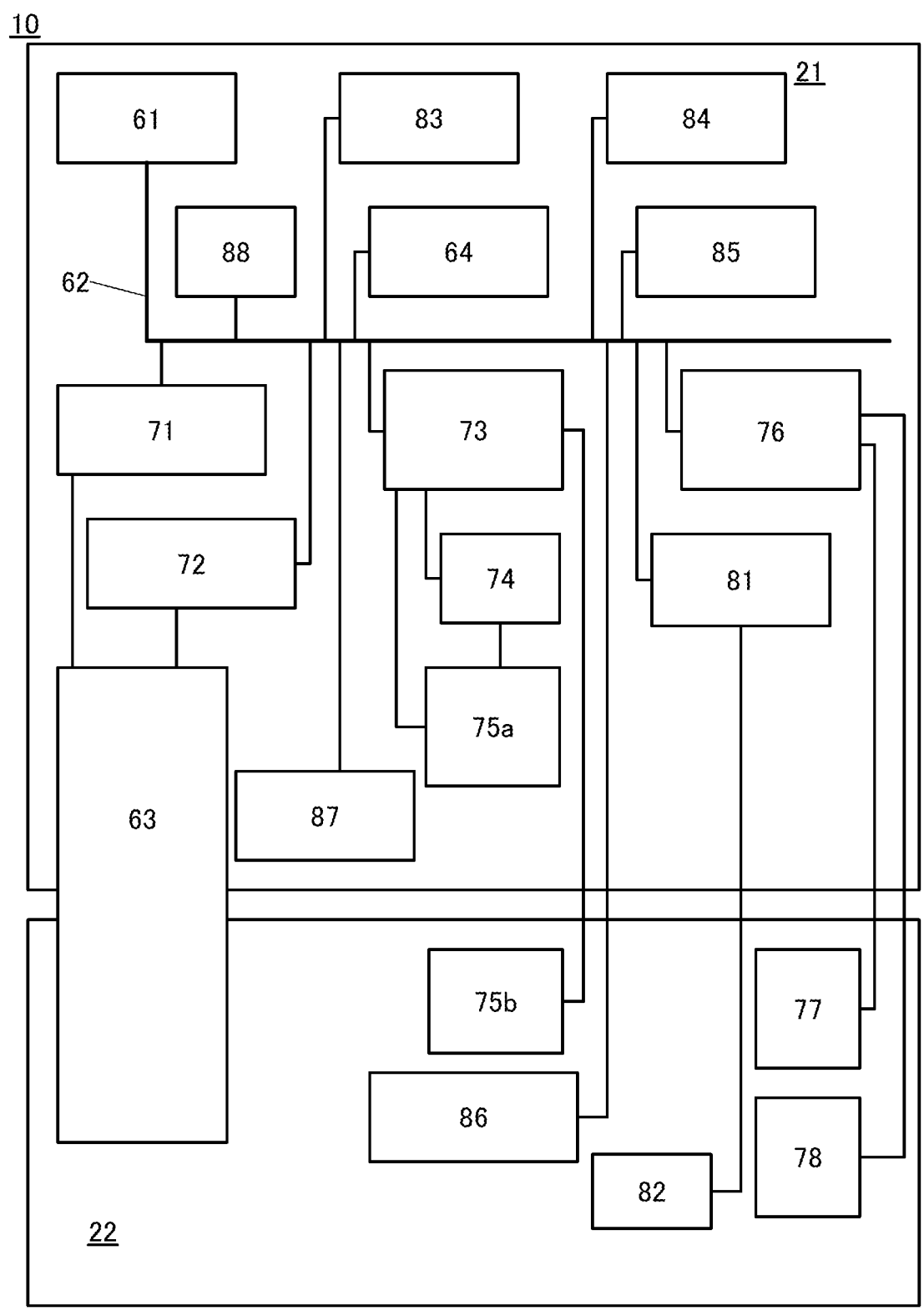
FIG. 13 is a block diagram of an electronic device of an embodiment.

FIG. 13 illustrates an example in which a battery module 75a and a battery module 75b are provided in the housing 21 and the housing 22, respectively. The battery module 75a and the battery module 75b which are provided in different housings can supply power received by the power receiving portion 74 through the battery controller 73. Alternatively, power may be directly supplied to the battery module 75b from the power receiving portion 74 through a power supply line which is not illustrated. The power receiving portion 74 and the battery controller 73 may be provided in both the housing 21 and the housing 22.

As a method for transmitting power or a signal between the two housings, an FPC crossing between the housings can be used. Alternatively, the two housings may include terminals in which their electrical connection is maintained regardless of their positional relationship. Alternatively, a wiring transmitting power or a signal may be extended between the two adjacent housings through the inside of a hinge. Alternatively, the FPC crossing between the housings may be attached on the side opposite to the display surface of the touch panel 63. Alternatively, power or a signal may be transmitted between the two housings by wireless communication.

Although FIG. 11 and FIG. 13 illustrate an example in which the audio input portion 77, the audio output portion 78, the antenna 82, and the camera module 86 are provided in the housing 22, they may be provided in the housing 21 or may be provided in both the housing 21 and the housing 22. The components provided in the housing 21 may be provided in the housing 22 or may be provided in both the housing 21 and the housing 22 in a similar manner.

The above is the description of the structural examples of the electronic device.

Application Example

One embodiment of the present invention can be used as a wearable electronic device (wearable device).

Figure 14:
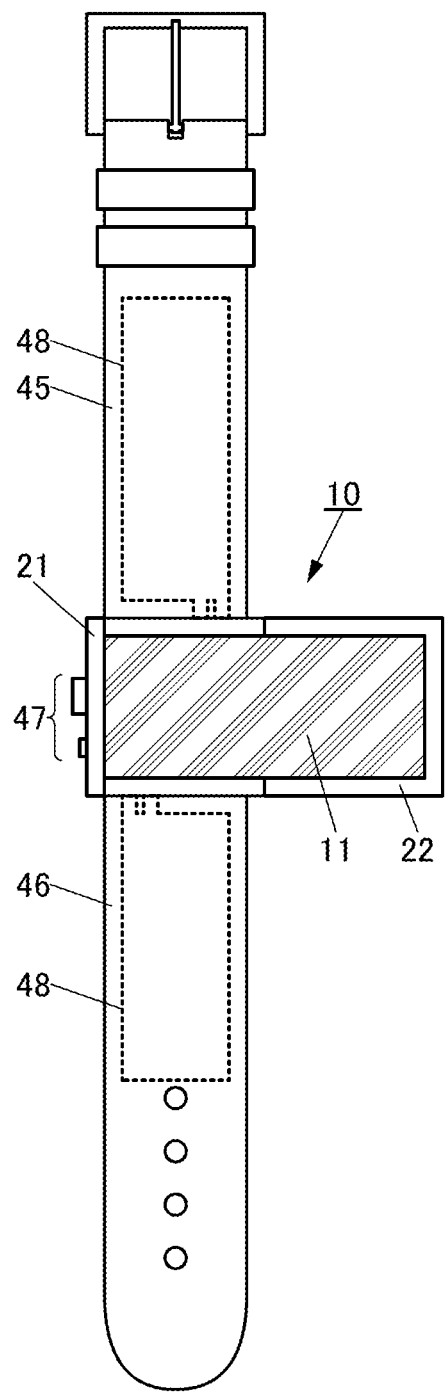
FIG. 14 illustrates a structural example of an electronic device of an embodiment.

FIG. 14 illustrates an example of a watch-type wearable device including the electronic device 10. The wearable device illustrated in FIG. 14 includes the electronic device 10, a band 45, a band 46, and the like. The band 45 includes a buckle and the band 46 includes a plurality of holes engaging with the buckle. The wearable device can be worn on an arm or the like with the two bands. Note that the structure of the band is not limited thereto, and a variety of bands can be used.

When the display panel 11 has a function as a touch panel, the electronic device 10 can be operated by touch on the display region.

Furthermore, FIG. 14 illustrates an example in which a housing button 47 is provided on the side surface of the housing 21 of the electronic device 10. As the input operation using the housing button 47, operations such as touching, pushing, turning, pulling, screwing, and sliding vertically, forward, and backward can be performed.

In addition, FIG. 14 illustrates an example in which a battery 48 is provided in each of the band 45 and the band 46. The battery 48 can be changed in shape together with the band 45 or the band 46 and can supply power to the electronic device 10. A battery controller managing charge and discharge of the battery 48 is incorporated in the electronic device 10. When the housing 21 or the housing 22 includes a main battery and the battery 48 is used as a sub-battery, a period when the electronic device 10 can be used by a single charge can be significantly extended. Alternatively, a battery does not necessarily provided in the housing 21 or the housing 22 and the battery 48 may be used as the main battery. With such a structure, the housing 21 and the housing 22 can be thin and lightweight.

Figure 15A:
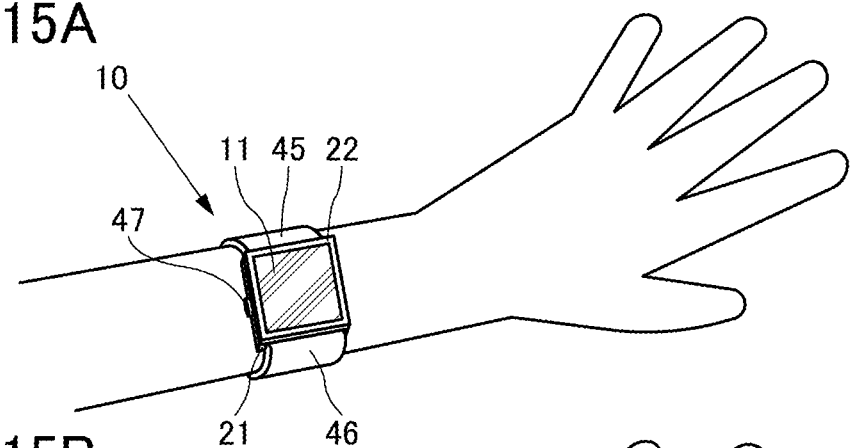
FIGS. 15A to 15C illustrate a structural example of an electronic device of an embodiment.
Figure 15B:
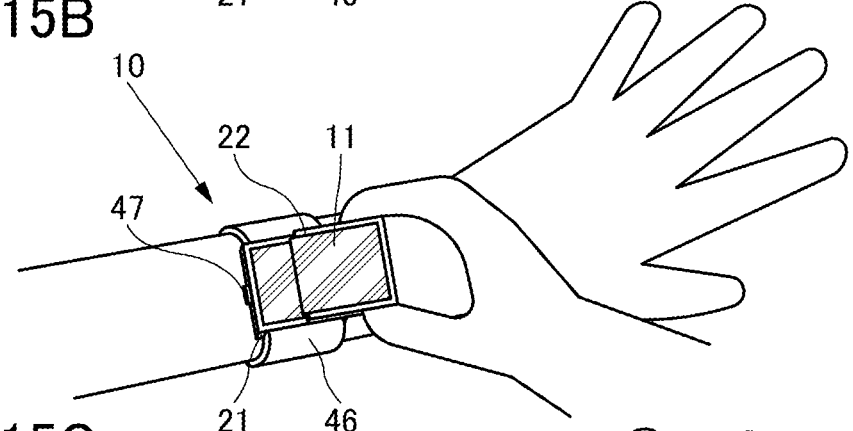
Figure 15C:
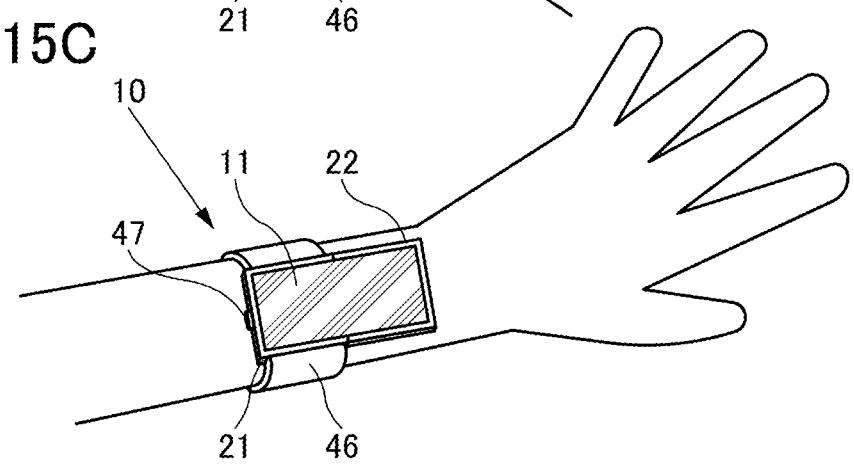

FIGS. 15A to 15C illustrate an example in which the wearable device is worn on. The wearable device can be reversibly changed in shape from a state where the housing 22 overlaps the housing 21 as illustrated in FIG. 15A to a state where the display panel 11 is spread as illustrated in FIG. 15C by sliding the housing 22 as illustrated in FIG. 15B. For example, the wearable device can be normally used in a state where the display panel 11 is folded and can also be used in the state where the display panel 11 is spread by sliding the housing 22 when a large display region is needed.

A lock mechanism is preferably provided so that the housing 21 and the housing 22 are not slid accidentally when overlapping with each other as illustrated in FIG. 15A. In that case, the lock state is preferably released by pushing the housing button 47, for example. Alternatively, the lock state may be released by utilizing restoring force of a spring or the like as a mechanism in which the wearable device is automatically changed in shape from the state illustrated in FIG. 15A to the state illustrated in FIG. 15C. A mechanism in which the wearable device is automatically changed in shape from the state illustrated in FIG. 15C to the state illustrated in FIG. 15A may also be employed. Alternatively, the relative positions of the housing 21 and the housing 22 may be fixed by utilizing magnetic force of a magnet instead of the lock mechanism. By utilizing the magnetic force, the housing 21 and the housing 22 can be easily attached or detached.

Figure 16A:
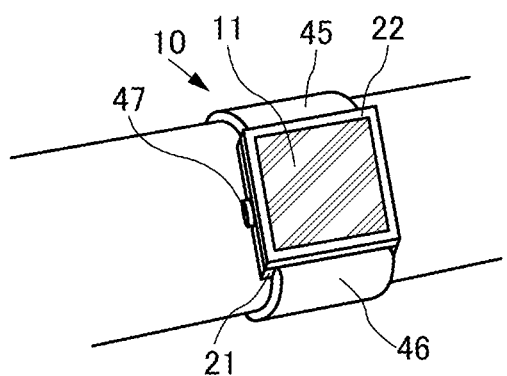
FIGS. 16A to 16D illustrate structural examples of an electronic device of an embodiment.
Figure 16B:
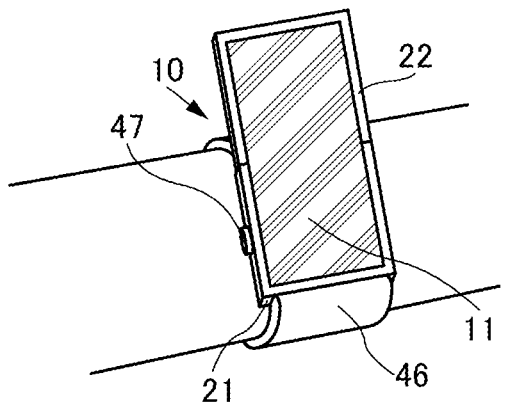

Although the housing 22 can be slid in a direction substantially perpendicular to the bending directions of the band 45 and the band 46 in FIGS. 15A to 15C, the housing 22 may be slid in a direction substantially parallel to the bending directions of the band 45 and the band 46 as illustrated in FIGS. 16A and 16B.

Figure 16C:
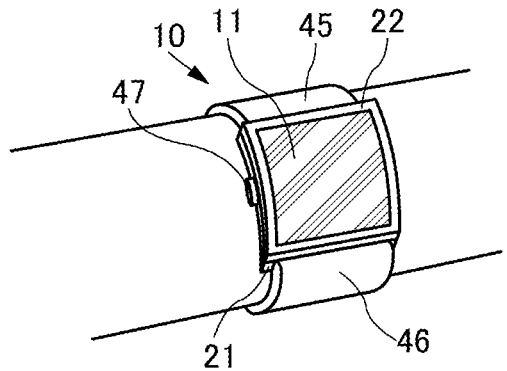
Figure 16D:
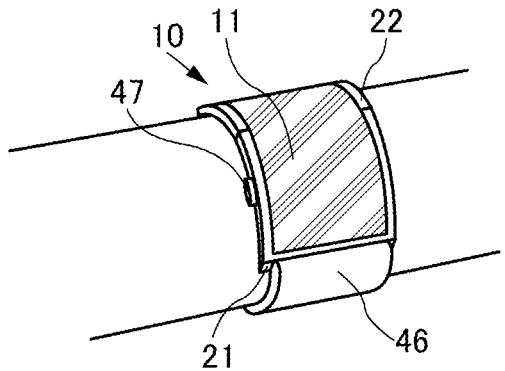

Furthermore, as illustrated in FIGS. 16C and 16D, the display surfaces of the housing 21 and the housing 22 may be convexly curved. When the housing 22 is slid, the slide direction is preferably along the band 45 or the band 46. At this time, the display surface is curved along an arm when the display panel 11 is opened. The housing 21 and the housing 22 wind around the arm along the band 45 and the band 46. Thus, a space between the housing 22 and the arm can be reduced, so that breakage of the housing 22 due to collision can be prevented. Even when the display panel 11 is opened, a user can wear the wearable device comfortably.

The above is the description of the application example.

At least part of this embodiment can be implemented in combination with any of the other embodiments described in this specification as appropriate.

Embodiment 2

Structural examples of an input device (touch sensor), an input/output device (touch panel), and the like which can be used for a display panel of an electronic device will be described below.

Note that in this specification and the like, a display panel has a function of displaying (outputting) an image or the like on (to) a display surface. Therefore, the display panel is one embodiment of an output device.

In this specification and the like, a structure in which a connector such as an FPC or a tape carrier package (TCP) is attached to a substrate of a display panel, or a structure in which an integrated circuit (IC) is mounted on a substrate by a chip on glass (COG) method or the like is referred to as a display panel module or a display module, or simply referred to as a display panel or the like in some cases.

In this specification and the like, a touch sensor has a function of sensing the touch, press, proximity, or the like of an object such as a finger or a stylus. In addition, the touch sensor may have a function of outputting the positional information of the object. Therefore, the touch sensor is one embodiment of an input device.

In this specification and the like, a substrate provided with a touch sensor is referred to as a touch sensor panel or simply referred to as a touch sensor or the like in some cases. Furthermore, in this specification and the like, a structure in which a connector such as an FPC or a TCP is attached to a substrate of a touch sensor panel, or a structure in which an IC is mounted on a substrate by a COG method or the like is referred to as a touch sensor panel module, a touch sensor module, or a sensor module, or simply referred to as a touch sensor or the like in some cases.

Note that in this specification and the like, a touch panel has a function of displaying (outputting) an image or the like on (to) a display surface and a function as a touch sensor capable of sensing the touch, press, proximity, or the like of an object such as a finger or a stylus on or to the display surface. Therefore, the touch panel is one embodiment of an input/output device.

A touch panel can be referred to, for example, a display panel (or a display device) with a touch sensor or a display panel (or a display device) having a touch sensor function.

A touch panel can include a display panel and a touch sensor panel. Alternatively, a touch panel can have a function of a touch sensor inside a display panel.

In this specification and the like, a structure in which a connector such as an FPC or a TCP is attached to a substrate of a touch panel, or a structure in which an IC is mounted on a substrate by a COG method or the like is referred to as a touch panel module or a display module, or simply referred to as a touch panel or the like in some cases.

Structural Example of Touch Sensor

A structural example of the input device (touch sensor) will be described below with reference to drawings.

Figure 17A:
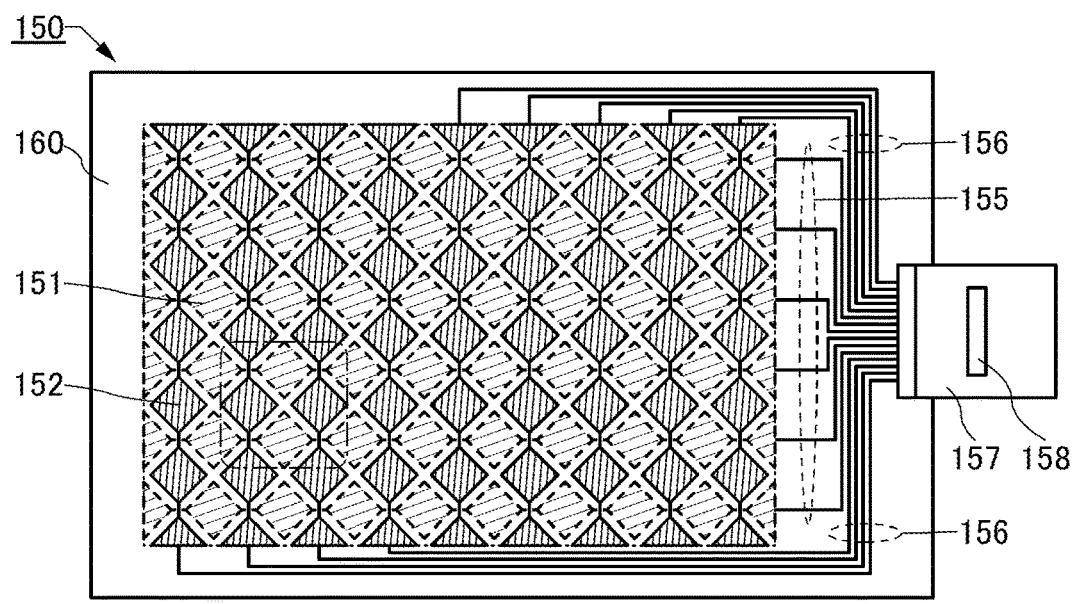
FIGS. 17A to 17D illustrate structural examples of an input device of an embodiment.

FIG. 17A is a schematic top view of an input device 150. The input device 150 includes a plurality of conductive layers 151, a plurality of conductive layers 152, a plurality of wirings 155, and a plurality of wirings 156 over a substrate 160. The substrate 160 is provided with an FPC 157 which is electrically connected to the plurality of conductive layers 151 and the plurality of conductive layers 152. FIG. 17A illustrates an example in which the FPC 157 is provided with an IC 158.

Figure 17B:
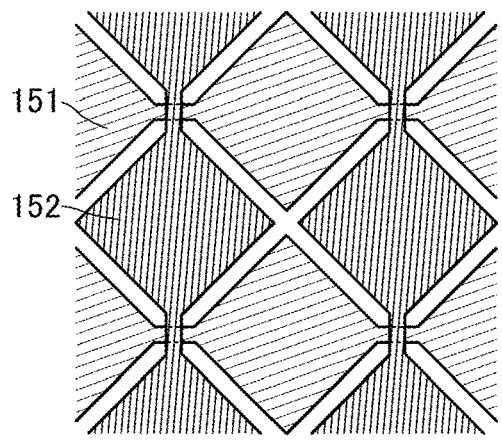

FIG. 17B is an enlarged view of a region surrounded by a dashed dotted line in FIG. 17A. The conductive layers 151 are in the form of a series of rhombic electrode patterns arranged in a lateral direction. The rhombic electrode patterns aligned in a line are electrically connected to each other. The conductive layers 152 are also in the form of a series of rhombic electrode patterns arranged in a longitudinal direction, and the rhombic electrode patterns aligned in a line are electrically connected to each other. Part of the conductive layer 151 and part of the conductive layer 152 overlap and intersect with each other. At this intersection portion, an insulator is sandwiched in order to avoid an electrical short-circuit between the conductive layer 151 and the conductive layer 152.

Figure 17C:
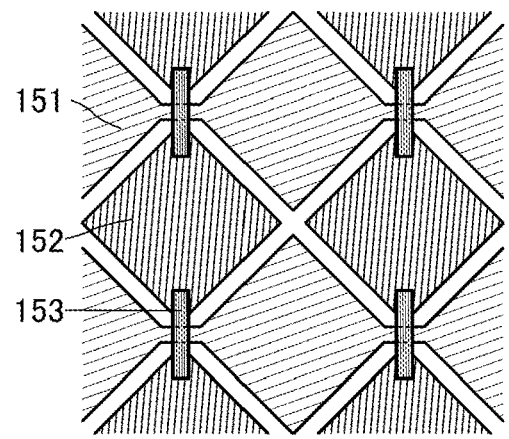

As illustrated in FIG. 17C, the rhombic conductive layers 152 may be connected with conductive layers 153. The island-shape conductive layers 152 are arranged in the longitudinal direction, and two adjacent conductive layers 152 are electrically connected to each other by the conductive layer 153. Such a structure allows the conductive layers 151 and the conductive layers 152 to be formed at the same time by processing the same conductive film. This can prevent variations in the thickness of these films, and can prevent the resistance value and the light transmittance of each electrode from varying from place to place. Note that instead of the conductive layers 152, the conductive layers 151 may include the conductive layers 153.

Figure 17D:
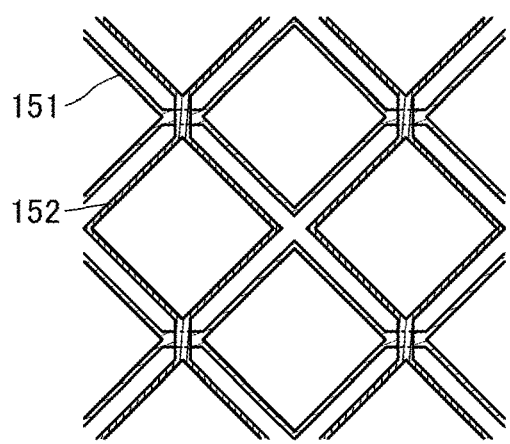

As illustrated in FIG. 17D, a design in which rhombic electrode patterns of the conductive layers 151 and the conductive layers 152 illustrated in FIG. 17B are hollowed out and only edge portions are left may be used. At that time, when the conductive layers 151 and the conductive layers 152 are narrow enough to be invisible to the users, the conductive layers 151 and the conductive layers 152 may be formed using a light-blocking material such as a metal or an alloy. In addition, either the conductive layers 151 or the conductive layers 152 illustrated in FIG. 17D may include the above conductive layers 153.

One of the conductive layers 151 is electrically connected to one of the wirings 155. One of the conductive layers 152 is electrically connected to one of the wirings 156. Here, either one of the conductive layers 151 and the conductive layers 152 corresponds to a row wiring, and the other corresponds to a column wiring.

The IC 158 has a function of driving the touch sensor. A signal output from the IC 158 is supplied to either of the conductive layers 151 and the conductive layers 152 through the wirings 155 or the wirings 156. A current (or a potential) flowing to either of the conductive layers 151 and the conductive layers 152 is input to the IC 158 through the wirings 155 or the wirings 156.

When a touch panel is formed in such a manner that the input device 150 is stacked over a display surface of the display panel, a light-transmitting conductive material is preferably used for the conductive layers 151 and 152. In the case where a light-transmitting conductive material is used for the conductive layers 151 and 152 and light from the display panel is extracted through the conductive layer 151 or the conductive layer 152, it is preferable that a conductive film containing the same conductive material be arranged between the conductive layers 151 and 152 as a dummy pattern. When part of a space between the conductive layers 151 and 152 is thus filled with the dummy pattern, variation in light transmittance can be reduced. As a result, unevenness in luminance of light transmitted through the input device 150 can be reduced.

As a light-transmitting conductive material, a conductive oxide such as indium oxide, indium tin oxide, indium zinc oxide, zinc oxide, or zinc oxide to which gallium is added can be used. Note that a film containing graphene can be used as well. The film containing graphene can be formed, for example, by reducing a film containing graphene oxide. As a reducing method, a method with application of heat or the like can be employed.

Alternatively, a metal film or an alloy film which is thin enough to have a light-transmitting property can be used. For example, a metal such as gold, silver, platinum, magnesium, nickel, tungsten, chromium, molybdenum, iron, cobalt, copper, palladium, or titanium, or an alloy containing any of these metals can be used. Alternatively, a nitride of the metal or the alloy (e.g., titanium nitride), or the like may be used. Alternatively, a stacked film in which two or more of conductive films containing the above materials are stacked may be used.

For the conductive layers 151 and 152, a conductive film that is processed to be thin enough to be invisible to the users may be used. Such a conductive film is processed into a lattice shape (a mesh shape), for example, which makes it possible to achieve both high conductivity and high visibility of the display device. It is preferable that the conductive film have a portion in which the width is greater than or equal to 30 nm and less than or equal to 100 µm, preferably greater than or equal to 50 nm and less than or equal to 50 µm, and further preferably greater than or equal to 50 nm and less than or equal to 20 µm. In particular, the conductive film having a pattern width of 10 µm or less is hardly visible to the users, which is preferable.

Figure 18A:
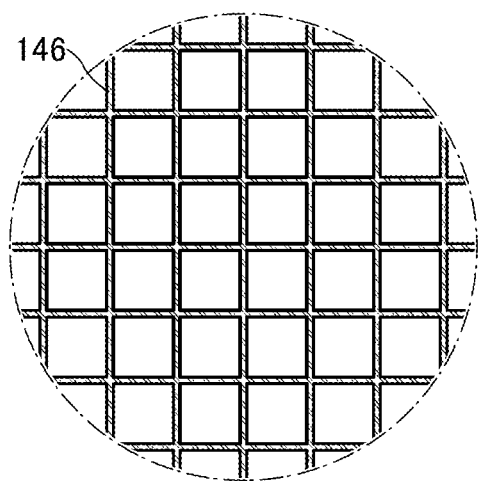
FIGS. 18A to 18D illustrate structural examples of an input device of an embodiment.

As examples, enlarged schematic views of part of the conductive layer 151 or the conductive layer 152 are illustrated in FIGS. 18A to 18D. FIG. 18A illustrates an example in which a lattice-shape conductive film 146 is used. The conductive film 146 is preferably placed so as not to overlap with the display element included in the display device because light from the display device is not blocked. In that case, it is preferable that the direction of the lattice be the same as the direction of the display element arrangement and that the pitch of the lattice be an integer multiple of the pitch of the display element arrangement.

Figure 18B:
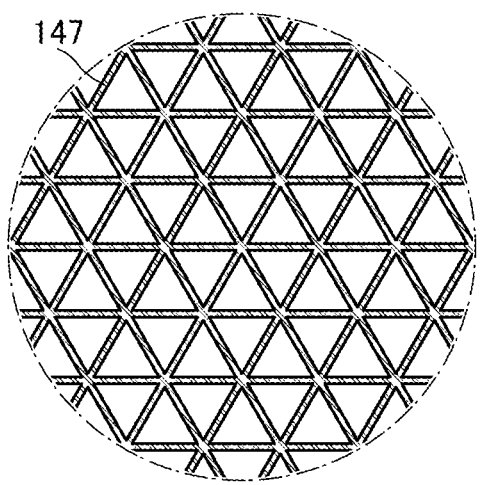

FIG. 18B illustrates an example of a lattice-shape conductive film 147, which is processed to have triangle openings. Such a structure makes it possible to further reduce the resistance compared with the structure illustrated in FIG. 18A.

Figure 18C:
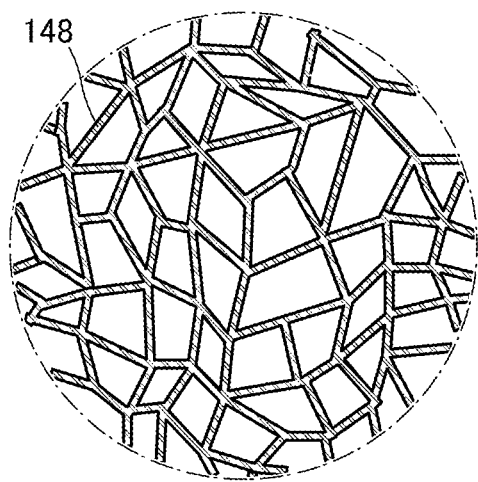

In addition, a conductive film 148, which has an irregular pattern shape, may be used as illustrated in FIG. 18C. Such a structure can prevent generation of moire when overlapping with the display portion of the display device.

Figure 18D:
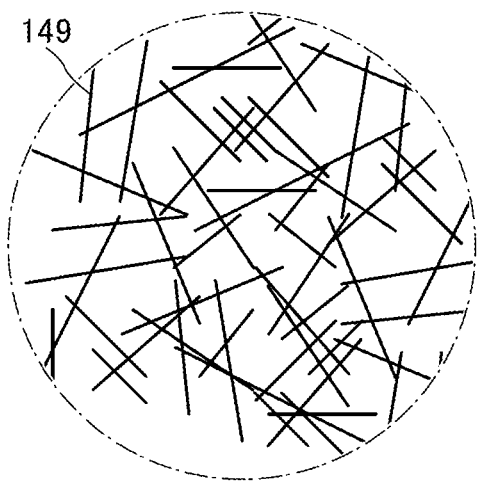

Conductive nanowires may be used for the conductive layers 151 and 152. FIG. 18D illustrates an example in which nanowires 149 are used. The nanowires 149 are dispersed at appropriate density so as to be in contact with the adjacent nanowires, which can form a two-dimensional network; therefore, the nanowires 149 can function as a conductive film with extremely high light-transmitting property. For example, nanowires which have a mean diameter of greater than or equal to 1 nm and less than or equal to 100 nm, preferably greater than or equal to 5 nm and less than or equal to 50 nm, further preferably greater than or equal to 5 nm and less than or equal to 25 nm can be used. As the nanowire 149, a metal nanowire such as an Ag nanowire, a Cu nanowire, or an Al nanowire, a carbon nanotube, or the like can be used. In the case of using an Ag nanowire, a light transmittance of 89% or more and a sheet resistance of 40 ohms per square or more and 100 ohms per square or less can be achieved.

The above is the description of structural examples of the touch sensor.

Structural Example of Touch Panel

Figure 19A:
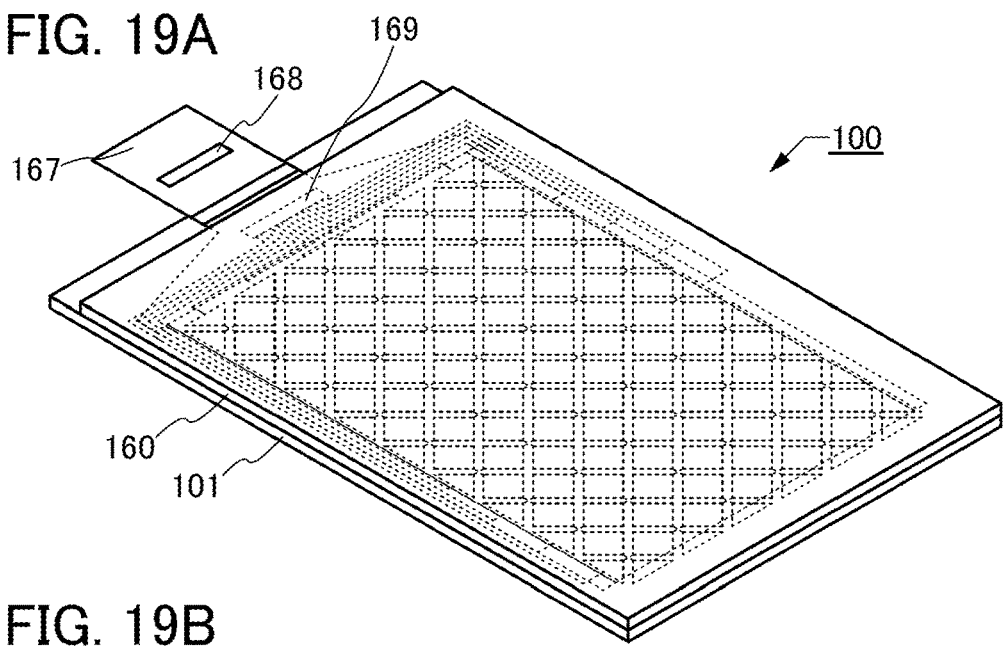
FIGS. 19A and 19B illustrate structural examples of a display device of an embodiment.
Figure 19B:
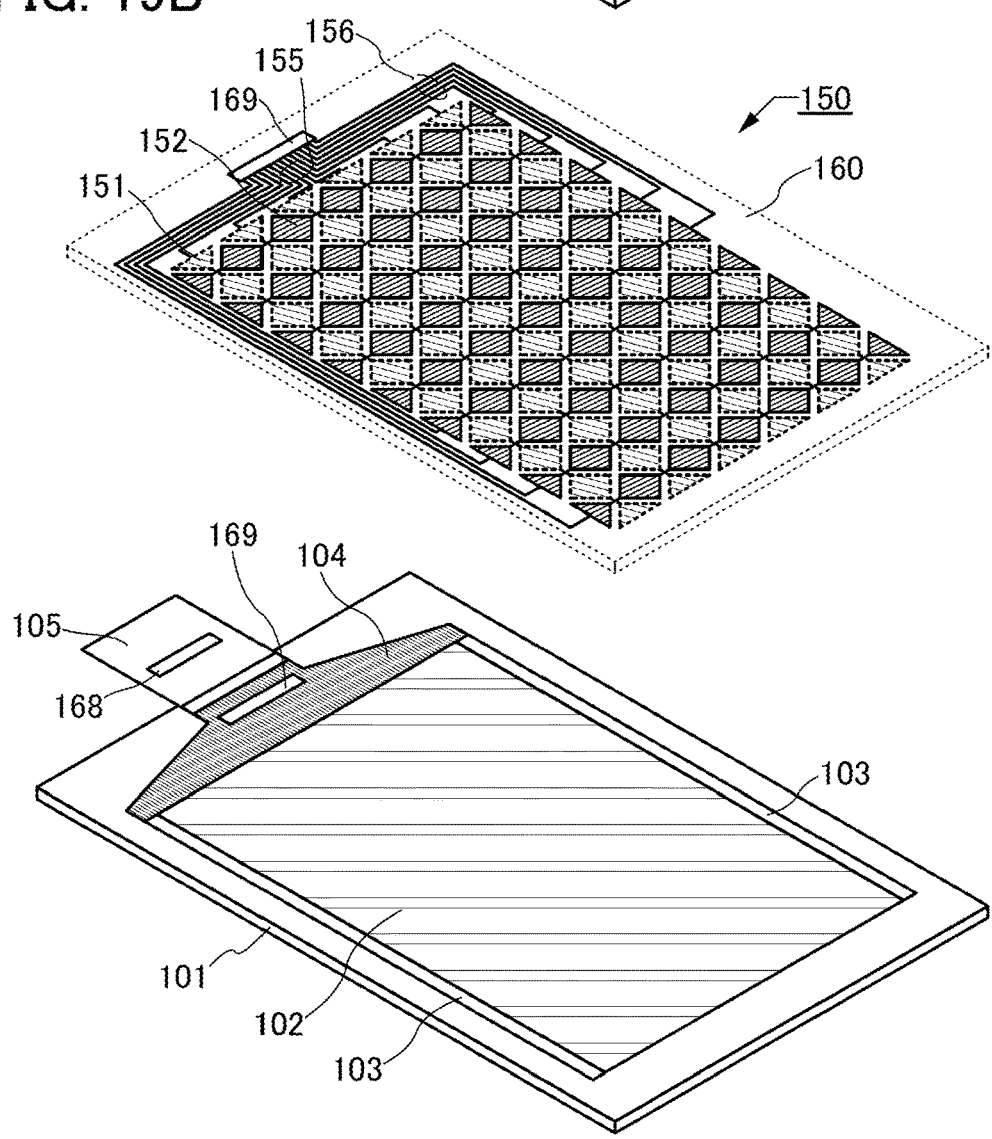

FIG. 19A is a schematic perspective view of a touch panel 100. FIG. 19B is an exploded view of the schematic perspective view of FIG. 19A. Note that only typical components are illustrated for simplicity. In FIG. 19B, the substrate 160 is illustrated only in dashed outline.

The touch panel 100 includes a substrate 101 and the substrate 160 which are provided to face each other.

A display portion 102, a circuit 103, a wiring 104, and the like are provided over the substrate 101. An FPC 167 is mounted on the substrate 101.

As the circuit 103, a circuit functioning as a scan line driver circuit or the like can be used.

The wiring 104 has a function of supplying a signal or power to the display portion 102 or the circuit 103. The signal or power is input to the wiring 104 from the outside through the FPC 167 or from the IC 168.

The substrate 160 is provided with the input device 150.

For the structure of the input device 150, the above description of the structural example of the touch sensor can be referred to. FIGS. 19A and 19B illustrate an example in which the input device 150 includes the plurality of conductive layers 151, the plurality of conductive layers 152, the plurality of wirings 155, and the plurality of wirings 156.

As the input device 150, for example, a capacitive touch sensor can be used. Examples of the capacitive touch sensor include a surface capacitive touch sensor and a projected capacitive touch sensor. Examples of the projected capacitive touch sensor include a self-capacitive touch sensor and a mutual capacitive touch sensor. The use of a mutual capacitive touch sensor is preferable because multiple points can be sensed simultaneously. An example of using a projected capacitive touch sensor will be described below.

Note that one embodiment of the present invention is not limited to this example, and any of a variety of sensors capable of sensing the proximity, touch, press, or the like of an object such as a finger or a stylus and outputting it can be used as the input device 150.

In the touch panel 100 illustrated in FIGS. 19A and 19B, the substrate 160 is provided with the input device 150. The wirings 155, the wirings 156, and the like of the input device 150 are electrically connected to the FPC 167 connected to the substrate 101 side through a connection portion 169. The connection portion 169 can include, for example, an anisotropic conductive connector.

With the above structure, the FPC connected to the touch panel 100 can be provided only on one substrate side (here, on the substrate 101 side). Although two or more FPCs may be attached to the touch panel 100, for the reduction of the number of components and the simplicity of the structure, the touch panel 100 is preferably provided with one FPC 167 which has a function of supplying signals to both the substrate 101 and the substrate 160 as illustrated in FIGS. 19A and 19B.

FIGS. 19A and 19B illustrate an example in which the IC 168 is mounted on the FPC 167 by a chip on film (COF)

method or the like. As the IC 168, an IC functioning as a signal line driver circuit or the like can be used. The IC 168 may have a function of driving the input device 150. In particular, the IC 168 preferably has a function as a signal line driver circuit and a function of driving the input device 150 because the number of components can be reduced.

Driving Method Example of Touch Sensor

Described below is an example of a driving method of an input device (touch sensor) which can be used in one embodiment of the present invention.

Figure 20A:
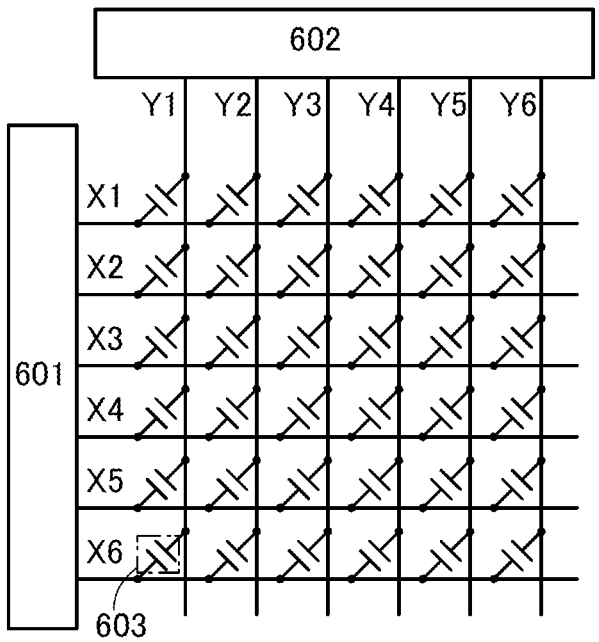
FIGS. 20A and 20B illustrate an example of a driving method of an input device of an embodiment.

FIG. 20A is a block diagram illustrating the structure of a mutual capacitive touch sensor. The touch sensor includes a pulse voltage output circuit 601 and a current sensing circuit 602. Six wirings X (wirings X1 to X6) are connected to the pulse voltage output circuit 601. Six wirings Y (wirings Y1 to Y6) are connected to the current sensing circuit 602. The number of wirings is not limited to those illustrated in this example One wiring X and one wiring Y form a capacitor 603.

For example, the conductive layers 151 correspond to one of the wiring X and the wiring Y, and the conductive layers 152 correspond to the other.

The pulse voltage output circuit 601 is, for example, a circuit for sequentially inputting a pulse voltage to the wirings X1 to X6. The current sensing circuit 602 is, for example, a circuit for measuring current flowing in each of the wirings Y1 to Y6.

The wirings X1 to X6 and the wirings Y1 to Y6 are capacitively coupled through the respective capacitors 603. Therefore, when a pulse voltage is applied to one of the wirings X1 to X6, current flows in each of the wirings Y1 to Y6. Part of an electric field generated between the pair of wirings is blocked by the touch, proximity, press, or the like (hereinafter, also referred to as touch operation) of an object such as a finger or a stylus on or to the sensing surface, so that the electric field intensity between the wirings is changed. Consequently, the amount of current flowing in the wirings Y1 to Y6 is changed.

When the touch operation is not performed, the amount of current flowing in the wirings Y1 to Y6 depends on the amount of capacitance of the capacitor 603. When part of the electric field is blocked by the touch operation, the amount of current flowing in the wirings Y1 to Y6 is decreased. The touch operation can be detected by the difference in current flowing in the wirings Y1 to Y6.

Obtaining by the current sensing circuit 602 may be performed using an integral value (time integral value) of current flowing in a wiring. In that case, an integrator circuit or the like can be used. Alternatively, the peak value of current can be obtained as a current value. In that case, for example, current may be converted into voltage, and the peak voltage value can be obtained.

Figure 20B:
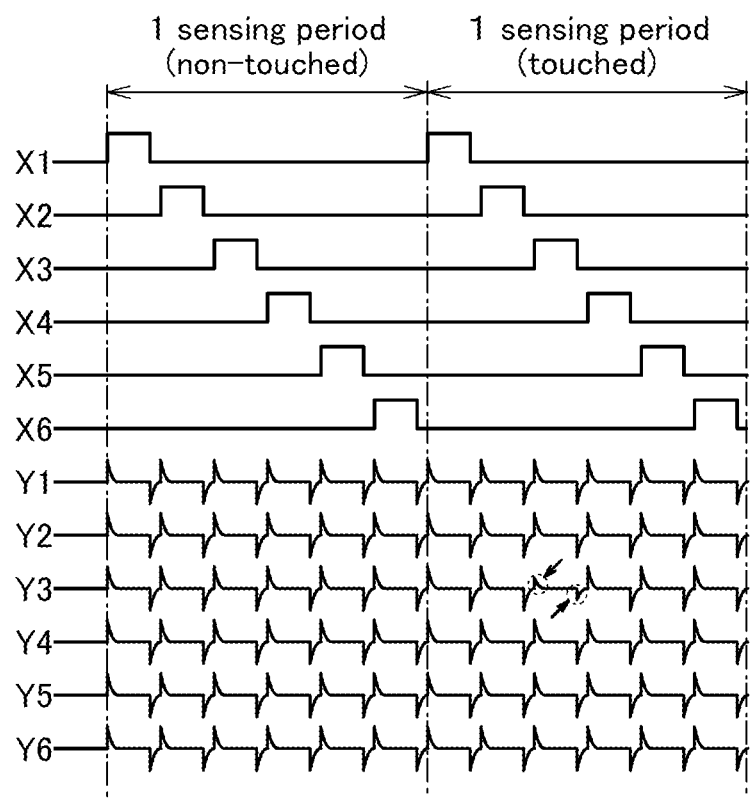

FIG. 20B is an example of a timing chart showing input and output waveforms in the mutual capacitive touch sensor in FIG. 20A. In FIG. 20B, sensing in all the rows and columns is performed in one sensing period. FIG. 20B shows a period when the touch operation is not performed (when the touch sensor is not touched) and a period when the touch operation is performed (when the touch sensor is touched). Here, the wirings Y1 to Y6 each show a waveform of a voltage corresponding to the direction and the amount of current flowing in each of the wirings.

As shown in FIG. 20B, the wirings X1 to X6 are sequentially supplied with a pulse voltage. Accordingly, current flows in the wirings Y1 to Y6. When the touch sensor is not touched, substantially the same current flows in the wirings Y1 to Y6 in accordance with a change in voltages of the wirings X1 to X6; thus, the wirings Y1 to Y6 have similar output waveforms. Meanwhile, when the touch sensor is touched, current flowing in the wiring Y in a position where the touch operation is performed is reduced; thus, the output waveforms are changed as shown in FIG. 20B.

FIG. 20B shows an example in which the touch operation is performed on the intersection of the wiring X3 and the wiring Y3 or the vicinity thereof.

A change in current flowing in the wirings due to block of the electric field generated between the pair of wirings by the object is utilized in this manner in the mutual capacitive touch sensor, so that positional information of the object can be obtained. When the sensitivity is high, the coordinates of the object can be determined even when the object is far from the sensing surface (e.g., a surface of the touch panel). The mutual capacitive touch sensor may have a function of detecting a pressure change by utilizing a change in the contact area with the object. In addition, the mutual capacitive touch sensor may have a function of detecting a pressure change by utilizing a decrease in the thickness of the touch panel and an increase in parasitic capacitance between the wirings that are caused when the sensing surface is pressed.

By driving a touch panel by a method in which a display period of a display portion and a sensing period of a touch sensor do not overlap with each other, the detection sensitivity of the touch sensor can be increased. For example, a display period and a sensing period may be separately provided in one display frame period. In that case, two or more sensing periods are preferably provided in one frame period. When the frequency of sensing is increased, the detection sensitivity can be increased.

It is preferable that, as an example, the pulse voltage output circuit 601 and the current sensing circuit 602 be formed in one IC chip. For example, the IC chip is preferably mounted on a touch panel or a substrate in a housing of an electronic device. In the case where the touch panel has flexibility, parasitic capacitance might be increased in a bent portion of the touch panel, and the influence of noise might be increased. In view of this, it is preferable to use an IC chip in which a driving method less influenced by noise is used. For example, it is preferable to use an IC chip in which a driving method capable of increasing a signal-noise ratio (S/N ratio) is used.

The above is the description of the driving method example of the touch sensor.

CROSS-SECTIONAL STRUCTURAL EXAMPLES

Examples of the cross-sectional structure of a touch panel are described below with reference to the drawings.

Cross-Sectional Structural Example 1

Figure 21:
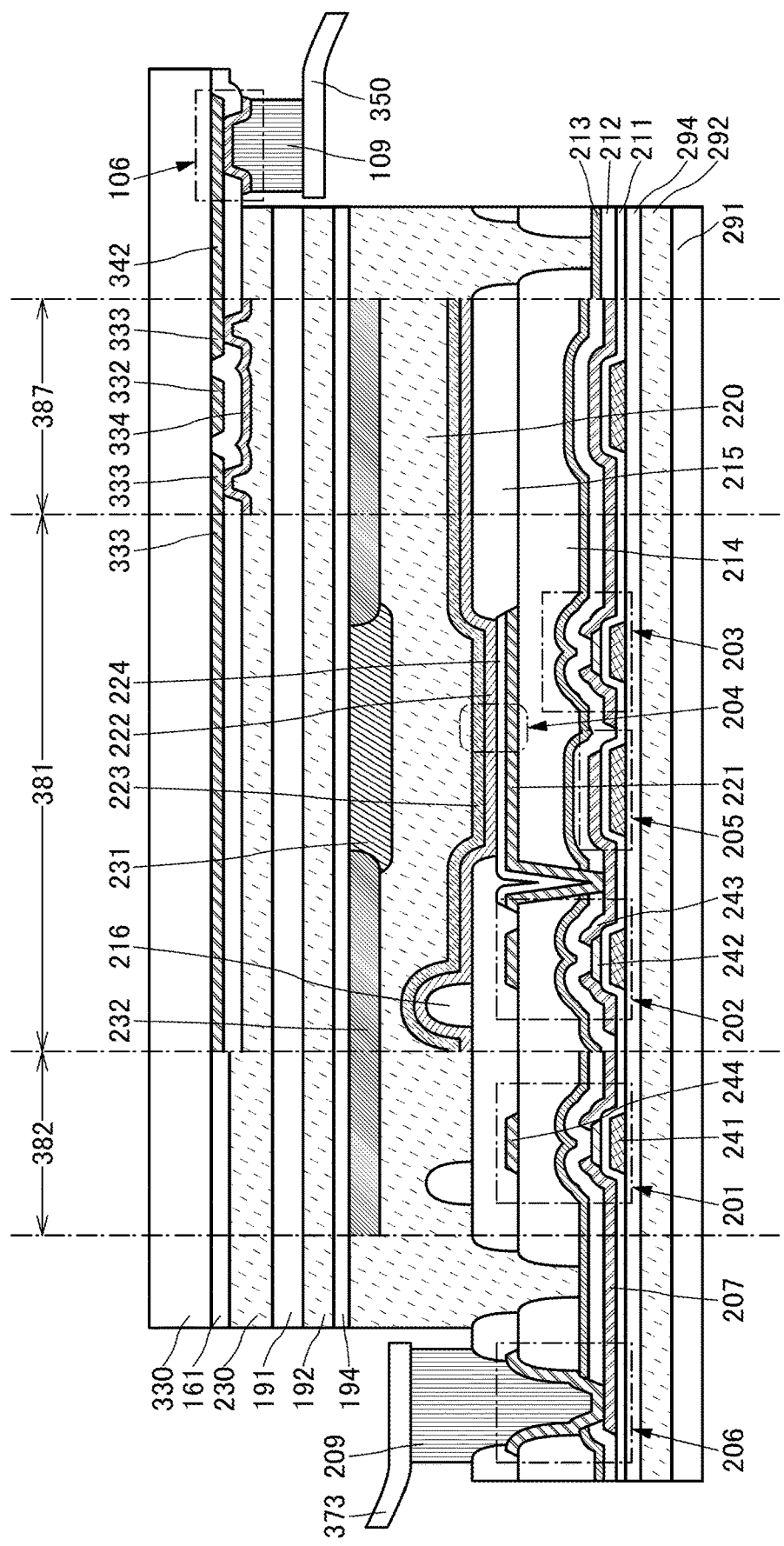
FIG. 21 illustrates a structural example of an input/output device of an embodiment.

FIG. 21 is a schematic cross-sectional view of the touch panel. The touch panel illustrated in FIG. 21 is what is called an externally attached touch panel in which a substrate provided with a touch sensor is attached to a display panel. FIG. 21 illustrates cross sections of a region including an FPC 373, a region including a driver circuit 382, a region including a display portion 381, and a region including an FPC 350.

The touch panel includes a substrate 291, a substrate 191, and a substrate 330. The substrate 291 and the substrate 191 are attached to each other with an adhesive layer 220. The substrate 191 and the substrate 330 are attached to each other with an adhesive layer 230. Here, a structure including the substrate 291, the substrate 191, and a stacked-layer structure provided therebetween corresponds to the display panel. A structure including a stacked-layer structure provided for the substrate 330 corresponds to the touch sensor.

Display Panel

A transistor 201, a transistor 202, a transistor 203, a display element 204, a capacitor 205, and the like are provided between the substrates 291 and 191.

The substrate 291 is attached to an insulating layer 294 with an adhesive layer 292. The substrate 191 is attached to an insulating layer 194 with an adhesive layer 192.

A material such as a resin having flexibility can be used for the substrates 291 and 191. Films having flexibility or the like are preferably used as the substrates 291 and 191. With the use of a material having flexibility for these substrates, a bendable display panel can be achieved. The substrate 291 and the substrate 191 each have a function of protecting a transistor or a light-emitting element and can be referred to as a protective film or the like.

A material through which impurities such as water and hydrogen do not easily diffuse is preferably used for the insulating layer 294 and the insulating layer 194. Such a structure can effectively suppress diffusion of the impurities into the display element 204 and the transistors from the outside even in the case of using a material permeable to moisture for the substrate 291 and the substrate 191, and a highly reliable touch panel can be achieved.

An insulating layer 211, an insulating layer 212, an insulating layer 213, an insulating layer 214, an insulating layer 215, a spacer 216, and the like are provided over the insulating layer 294. Part of the insulating layer 211 functions as a gate insulating layer of each transistor, and another part thereof functions as a dielectric of the capacitor 205. The insulating layer 212, the insulating layer 213, and the insulating layer 214 are provided to cover each transistor, the capacitor 205, and the like. The insulating layer 214 functions as a planarization layer. Note that an example in which the three insulating layers, the insulating layers 212, 213, and 214, are provided to cover the transistors and the like is described here; however, the present invention is not limited to this example, and four or more insulating layers, a single insulating layer, or two insulating layers may be provided. The insulating layer 214 functioning as a planarization layer is not necessarily provided when not needed.

The display element 204 is provided over the insulating layer 214. An example in which a top-emission organic EL element is used as the display element 204 is described here. The display element 204 emits light to a second electrode 223 side. The transistors 202 and 203, the capacitor 205, a wiring, and the like are provided to overlap with a light-emitting region of the display element 204. Thus, an aperture ratio of the display portion 381 can be increased.

The display element 204 includes an EL layer 222 between a first electrode 221 and the second electrode 223. An optical adjustment layer 224 is provided between the first electrode 221 and the EL layer 222. The insulating layer 215 is provided to cover end portions of the first electrode 221 and the optical adjustment layer 224.

FIG. 21 illustrates a cross section of one pixel as an example of the display portion 381. An example in which the pixel includes the transistor 202 for current control, the transistor 203 for switching control, and the capacitor 205 is described here. One of a source and a drain of the transistor 202 and one electrode of the capacitor 205 are electrically connected to the first electrode 221 through an opening provided in the insulating layers 212, 213, and 214.

FIG. 21 illustrates an example of the driver circuit 382 in which the transistor 201 is provided.

Each of the transistors 201, 202, and 203 includes a conductive layer 241 functioning as a gate, a semiconductor layer 242, a pair of conductive layers 243 functioning as a source and a drain.

In the example illustrated in FIG. 21, the transistors 201 and 202 each have a structure in which the semiconductor layer 242 where a channel is formed is provided between two gates (the conductive layer 241 and a conductive layer 244). Such transistors can have higher field-effect mobility and thus have higher on-state current than other transistors. Consequently, a circuit capable of high-speed operation can be obtained. Furthermore, the area occupied by a circuit can be reduced. The use of the transistor having high on-state current can reduce signal delay in wirings and can reduce display luminance variation even in a display panel in which the number of wirings is increased because of increase in size or resolution.

Note that the transistors provided in the driver circuit 382 and the display portion 381 may have the same structure or different structures.

A material through which impurities such as water and hydrogen do not easily diffuse is preferably used for at least one of the insulating layers 212 and 213 which cover the transistors. That is, the insulating layer 212 or the insulating layer 213 can function as a barrier film Such a structure can effectively suppress diffusion of the impurities into the transistors from the outside, and a highly reliable touch panel can be achieved.

The spacer 216 is provided over the insulating layer 215 and has a function of adjusting the distance between the substrate 291 and the substrate 191. In the example illustrated in FIG. 21, there is a gap between the spacer 216 and a light-blocking layer 232, which may however be in contact with each other. Although the spacer 216 is provided on the substrate 291 side in the structure described here, the spacer 216 may be provided on the substrate 191 side (e.g., in a position closer to the substrate 191 than that of the light-blocking layer 232). Alternatively, a particulate spacer may be used instead of the spacer 216. Although a material such as silica can be used for the particulate spacer, an elastic material such as an organic resin or rubber is preferably used. In some cases, the particulate spacer may be vertically crushed.

A coloring layer 231, the light-blocking layer 232, and the like are provided on the substrate 291 side of the insulating layer 194. The light-blocking layer 232 has an opening, and the opening is provided to overlap with the display region of the display element 204. An insulating layer which functions as an overcoat may be provided to cover the coloring layer 231 and the light-blocking layer 232.

A connection portion 206 is provided in a region near an end portion of the substrate 291. The connection portion 206 is electrically connected to the FPC 373 through a connection layer 209. In the example of the structure illustrated in FIG. 21, the connection portion 206 is formed by stacking part of a wiring 207 which is electrically connected to the driver circuit 382 and a conductive layer which is formed by processing a conductive film used for forming the first electrode 221. When the connection portion 206 is formed by stacking two or more conductive layers as described above, electric resistance can be reduced and mechanical strength of the connection portion 206 can be increased.

Furthermore, FIG. 21 illustrates a cross-sectional structure of a crossing portion 387 in which a wiring formed by processing a conductive film used for forming the gate electrode of the transistor and a wiring formed by processing a conductive film used for forming the source electrode and the drain electrode of the transistor cross each other.

Input Device

An electrode 333 and an electrode 332 are provided on the surface on the substrate 291 side of the substrate 330. An example in which a bridge electrode 334 connected to the electrode 333 is included is described here. As illustrated in the crossing portion 387 in FIG. 21, the electrode 332 and the electrode 333 are formed on the same plane. The bridge electrode 334 is provided on the surface on the substrate 291 side of an insulating layer 161 which is provided to cover the electrode 332 and the electrode 333. The bridge electrode 334 electrically connects two electrodes 333, between which the electrode 332 is provided, through openings formed in the insulating layer 161.

A connection portion 106 is provided in a region near an end portion of the substrate 330. The connection portion 106 is electrically connected to the FPC 350 through a connection layer 109. In the example of the structure illustrated in FIG. 21, the connection portion 106 is formed by stacking part of a wiring 342 and a conductive layer which is formed by processing a conductive film used for forming the bridge electrode 334.

The substrate 330 here can be used also as a substrate with which an object, such as a finger or a stylus, is to be in contact. In that case, a protective layer (such as a ceramic coat) is preferably provided over the substrate 330. The protective layer can be formed using an inorganic insulating material such as silicon oxide, aluminum oxide, yttrium oxide, or yttria-stabilized zirconia (YSZ). Alternatively, tempered glass may be used for the substrate 330. Physical or chemical processing may be performed on the tempered glass, so that compressive stress is applied on the surface. As such processing, an ion exchange method, a wind tempering method, or the like can be used. In the case where the touch sensor is provided on one side of the tempered glass and the opposite side of the tempered glass is provided on, for example, the outermost surface of an electronic device for use as a touch surface, the thickness of the whole device can be reduced.

The substrate 330 preferably includes a flexible portion to be bent with at least the display panel. The substrate 330 can be formed using a material similar to that of the substrate 291, the substrate 191, or the like.

Components

The above components will be described below.

A substrate having a flat surface can be used as the substrate included in the touch panel. The substrate through which light emitted from the display element is extracted is formed using a material that transmits the light. For example, a material such as glass, quartz, ceramic, sapphire, or an organic resin can be used.

The weight and thickness of the touch panel can be reduced by using a thin substrate. Furthermore, a flexible touch panel can be obtained by using a substrate that is thin enough to have flexibility.

As the glass, for example, alkali-free glass, barium borosilicate glass, aluminoborosilicate glass, or the like can be used.

Examples of a material having flexibility and transmitting visible light include glass that is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polytetrafluoroethylene (PTFE) resin. In particular, a material whose thermal expansion coefficient is low is preferred, and for example, a polyamide imide resin, a polyimide resin, or PET with a thermal expansion coefficient of $30 \times 10^{-6}$/K or less can be suitably used. A substrate in which a glass fiber is impregnated with an organic resin or a substrate whose thermal expansion coefficient is reduced by mixing an organic resin with an inorganic filler can also be used. A substrate using such a material is lightweight, and thus, a touch panel using this substrate can also be lightweight.

Since the substrate through which light is not extracted does not need to have a light-transmitting property, a metal substrate or the like can be used as well as the above-mentioned substrates. A metal substrate, which has high thermal conductivity, is preferable because it can easily conduct heat to the whole substrate and accordingly can prevent a local temperature rise in the touch panel. To obtain flexibility or bendability, the thickness of a metal substrate is preferably greater than or equal to 10 μm and less than or equal to 200 μm, further preferably greater than or equal to 20 μm and less than or equal to 50 μm.

Although there is no particular limitation on a material of the metal substrate, it is preferable to use, for example, a metal such as aluminum, copper, or nickel, or an alloy such as an aluminum alloy or stainless steel.

It is possible to use a substrate subjected to insulation treatment in such a manner that a surface of a metal substrate is oxidized or an insulating film is formed on a surface. An insulating film may be formed by, for example, a coating method such as a spin-coating method or a dipping method, an electrodeposition method, an evaporation method, or a sputtering method. An oxide film may be formed on the substrate surface by an anodic oxidation method, exposing to or heating in an oxygen atmosphere, or the like.

The flexible substrate may have a stacked structure of a layer of any of the above-mentioned materials and a hard coat layer (e.g., a silicon nitride layer) which protects a surface of the touch panel from damage or the like, a layer (e.g., an aramid resin layer) which can disperse pressure, or the like. Furthermore, to suppress a decrease in the lifetime of the light-emitting element due to moisture or the like, an insulating film with low water permeability may be provided. For example, a film containing nitrogen and silicon (e.g., a silicon nitride film or a silicon oxynitride film) or a film containing nitrogen and aluminum (e.g., an aluminum nitride film) may be provided.

The substrate may be formed by stacking a plurality of layers. In particular, when a glass layer is used, a barrier property against water and oxygen can be improved, and thus, a highly reliable touch panel can be provided. For example, a substrate in which a glass layer, an adhesive layer, and an organic resin layer are stacked in this order from the side closer to the light-emitting element can be used. By providing such an organic resin layer, a crack or a break in the glass layer can be suppressed and mechanical strength can be improved. With the substrate that includes such a composite material of a glass material and an organic resin, a highly reliable and flexible touch panel can be provided.

The transistor includes a conductive layer functioning as the gate electrode, the semiconductor layer, a conductive layer functioning as the source electrode, a conductive layer functioning as the drain electrode, and an insulating layer functioning as the gate insulating layer. FIG. 21 illustrates the case where a bottom-gate transistor is used.

Note that there is no particular limitation on the structure of the transistor included in the touch panel of one embodiment of the present invention. For example, a staggered transistor or an inverted staggered transistor may be used. A top-gate transistor or a bottom-gate transistor may be used. There is no particular limitation on a semiconductor material used for the transistor, and an oxide semiconductor, silicon, or germanium can be used, for example.

There is no particular limitation on the crystallinity of a semiconductor material used for the transistor, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be suppressed.

As a semiconductor material used for the semiconductor layer of the transistor, an element of Group 14 (e.g., silicon or germanium), a compound semiconductor, or an oxide semiconductor can be used, for example Typically, a semiconductor containing silicon, a semiconductor containing gallium arsenide, an oxide semiconductor containing indium, or the like can be used.

In particular, an oxide semiconductor having a wider band gap than silicon is preferably used. A semiconductor material having a wider band gap and a lower carrier density than silicon is preferably used because off-state current of the transistor can be reduced.

For example, the oxide semiconductor preferably contains at least indium (In) or zinc (Zn). The oxide semiconductor further preferably includes an In-M-Zn-based oxide (M is a metal such as Al, Ti, Ga, Ge, Y, Zr, Sn, La, Ce, or Hf).

As the semiconductor layer, it is particularly preferable to use an oxide semiconductor film including a plurality of crystal parts whose c-axes are aligned substantially perpendicular to a surface on which the semiconductor layer is formed or the top surface of the semiconductor layer and in which a grain boundary is not observed between adjacent crystal parts.

There is no grain boundary in such an oxide semiconductor; therefore, generation of a crack in an oxide semiconductor film which is caused by stress when a display panel is bent is prevented. Consequently, such an oxide semiconductor can be preferably used for a flexible touch panel which is used in a bent state, or the like.

Moreover, the use of such an oxide semiconductor with crystallinity for the semiconductor layer makes it possible to provide a highly reliable transistor in which a variation in electrical characteristics is suppressed.

A transistor with an oxide semiconductor whose band gap is larger than that of silicon can hold electric charge accumulated in a capacitor that is series-connected to the transistor for a long time, owing to the low off-state current of the transistor. When such a transistor is used for a pixel, operation of a driver circuit can be stopped while a gray scale of each pixel is maintained. As a result, a display device with extremely low power consumption can be obtained.

Alternatively, silicon is preferably used as a semiconductor in which a channel of the transistor is formed. Although amorphous silicon may be used as silicon, silicon having crystallinity is particularly preferable. For example, microcrystalline silicon, polycrystalline silicon, single crystal silicon, or the like is preferably used. In particular, polycrystalline silicon can be formed at a lower temperature than single crystal silicon and has higher field-effect mobility and higher reliability than amorphous silicon. When such a polycrystalline semiconductor is used for a pixel, the aperture ratio of the pixel can be improved. Even in the case where a display device has extremely high resolution, a scan line driver circuit and a signal line driver circuit can be formed over a substrate over which the pixels are formed, and the number of components of an electronic device can be reduced.

Alternatively, transistors including different semiconductors may also be provided. For example, a transistor including polycrystalline silicon and a transistor including an oxide semiconductor may be provided in combination. At this time, polycrystalline silicon is preferably used for a transistor to which large current needs to be supplied, such as a transistor in the driver circuit or a transistor for current control. Furthermore, an oxide semiconductor is preferably used for a transistor which holds electric charge accumulated in a capacitor or the like that is series-connected to the transistor, such as a switching transistor in a pixel.

As materials for a gate, a source, and a drain of a transistor, and conductive layers such as wirings and electrodes included in a touch panel, any of metals such as aluminum, titanium, chromium, nickel, copper, yttrium, zirconium, molybdenum, silver, tantalum, and tungsten, or an alloy containing any of these metals as its main component can be used. A single-layer structure or a stacked-layer structure including a film containing any of these materials can be used. For example, the following structures can be given: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that an oxide such as indium oxide, tin oxide, or zinc oxide may be used. Copper containing manganese is preferably used because controllability of a shape by etching is increased.

As a light-transmitting material that can be used for conductive layers such as wirings and electrodes in the touch panel, a conductive oxide such as indium oxide, indium tin oxide, indium zinc oxide, zinc oxide, or zinc oxide to which gallium is added, or graphene can be used. Alternatively, a metal material such as gold, silver, platinum, magnesium, nickel, tungsten, chromium, molybdenum, iron, cobalt, copper, palladium, or titanium or an alloy material containing any of these metal materials can be used. Alternatively, a nitride of the metal material (e.g., titanium nitride) or the like may be used. In the case of using the metal material or the alloy material (or the nitride thereof), the thickness is set small enough to be able to transmit light. Alternatively, a stacked film of any of the above materials can be used as the conductive layer. For example, a stacked film of indium tin oxide and an alloy of silver and magnesium is preferably used because the conductivity can be increased.

As an insulating material that can be used for the insulating layers, the overcoat, the spacer, and the like, a resin such as acrylic or epoxy, a resin having a siloxane bond such as a silicone resin, or an inorganic insulating material such as silicon oxide, silicon oxynitride, silicon nitride oxide, silicon nitride, or aluminum oxide can be used.

The light-emitting element is preferably provided between a pair of insulating films with low water permeability, in which case impurities such as water can be prevented from entering the light-emitting element. Thus, a decrease in device reliability can be prevented.

As an insulating film with low water permeability, a film containing nitrogen and silicon (e.g., a silicon nitride film or a silicon nitride oxide film), a film containing nitrogen and aluminum (e.g., an aluminum nitride film), or the like can be used. Alternatively, a silicon oxide film, a silicon oxynitride film, an aluminum oxide film, or the like may be used.

For example, the water vapor transmittance of the insulating film with low water permeability is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], still further preferably lower than or equal to $1\times10^{-8}$ [g/(m$^2$·day)].

As the adhesive layers, a variety of curable adhesives, e.g., a photo-curable adhesive such as an ultraviolet curable adhesive, a reactive curable adhesive, a thermosetting curable adhesive, and an anaerobic adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component-mixture-type resin may be used. Further alternatively, an adhesive sheet or the like may be used.

Furthermore, the resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can prevent impurities such as moisture from entering a functional element, thereby improving the reliability of the display panel.

In addition, a filler with a high refractive index or a light-scattering member may be mixed into the resin, in which case the efficiency of light extraction from the light-emitting element can be improved. For example, titanium oxide, barium oxide, zeolite, or zirconium can be used.

As the light-emitting element, a self-luminous element can be used, and an element whose luminance is controlled by current or voltage is included in the category of the light-emitting element. For example, a light-emitting diode (LED), an organic EL element, or an inorganic EL element can be used.

The light-emitting element may be a top emission, bottom emission, or dual emission light-emitting element. A conductive film that transmits visible light is used as the electrode through which light is extracted. A conductive film that reflects visible light is preferably used as the electrode through which light is not extracted.

The EL layer includes at least a light-emitting layer. In addition to the light-emitting layer, the EL layer may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer, either a low-molecular compound or a high-molecular compound can be used, and an inorganic compound may also be used. The layers included in the EL layer can be formed by any of the following methods: an evaporation method (including a vacuum evaporation method), a transfer method, a printing method, an inkjet method, a coating method, and the like.

When a voltage higher than the threshold voltage of the light-emitting element is applied between a cathode and an anode, holes are injected to the EL layer from the anode side and electrons are injected to the EL layer from the cathode side. The injected electrons and holes are recombined in the EL layer and a light-emitting substance contained in the EL layer emits light.

In the case where a light-emitting element emitting white light is used as the light-emitting element, the EL layer preferably contains two or more kinds of light-emitting substances. For example, light-emitting substances are selected so that two or more light-emitting substances emit complementary colors to obtain white light emission. Specifically, it is preferable to contain two or more light-emitting substances selected from light-emitting substances emitting light of red (R), green (G), blue (B), yellow (Y), orange (0), and the like and light-emitting substances emitting light containing two or more of spectral components of R, G, and B. The light-emitting element preferably emits light with a spectrum having two or more peaks in the wavelength range of a visible light region (e.g., 350 nm to 750 nm). An emission spectrum of a material emitting light having a peak in a yellow wavelength range preferably includes spectral components also in green and red wavelength ranges.

A light-emitting layer containing a light-emitting material emitting light of one color and a light-emitting layer containing a light-emitting material emitting light of another color are preferably stacked in the EL layer. For example, the plurality of light-emitting layers in the EL layer may be stacked in contact with each other or may be stacked with a region not including any light-emitting material therebetween. For example, between a fluorescent layer and a phosphorescent layer, a region containing the same material as one in the fluorescent layer or phosphorescent layer (for example, a host material or an assist material) and no light-emitting material may be provided. This facilitates the manufacture of the light-emitting element and reduces the drive voltage.

The light-emitting element may be a single element including one EL layer or a tandem element in which a plurality of EL layers are stacked with a charge generation layer therebetween.

For the conductive film that transmits visible light, for example, indium oxide, indium tin oxide, indium zinc oxide, zinc oxide, or zinc oxide to which gallium is added can be used. Alternatively, a film of a metal material such as gold, silver, platinum, magnesium, nickel, tungsten, chromium, molybdenum, iron, cobalt, copper, palladium, or titanium;

an alloy containing any of these metal materials; or a nitride of any of these metal materials (e.g., titanium nitride) can be used when formed thin enough to have a light-transmitting property. Alternatively, a stacked film of any of the above materials can be used as the conductive layer. For example, a stacked film of indium tin oxide and an alloy of silver and magnesium is preferably used because the conductivity can be increased. Further alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. Lanthanum, neodymium, germanium, or the like may be added to the metal material or the alloy. Alternatively, an alloy containing aluminum (an aluminum alloy) such as an alloy of aluminum and titanium, an alloy of aluminum and nickel, or an alloy of aluminum and neodymium may be used. Alternatively, an alloy containing silver such as an alloy of silver and copper, an alloy of silver and palladium, or an alloy of silver and magnesium may be used. An alloy containing silver and copper is preferable because of its high heat resistance. Furthermore, when a metal film or a metal oxide film is stacked in contact with an aluminum film or an aluminum alloy film, oxidation of the aluminum alloy film can be suppressed. Examples of a material for the metal film or the metal oxide film include titanium and titanium oxide. Alternatively, the above conductive film that transmits visible light and a film containing a metal material may be stacked. For example, a stacked film of silver and indium tin oxide or a stacked film of an alloy of silver and magnesium and indium tin oxide can be used.

The conductive layers may each be formed by an evaporation method or a sputtering method. Alternatively, a discharging method such as an inkjet method, a printing method such as a screen printing method, or a plating method may be used.

Note that the aforementioned light-emitting layer and layers containing a substance with a high hole-injection property, a substance with a high hole-transport property, a substance with a high electron-transport property, a substance with a high electron-injection property, and a substance with a bipolar property may include an inorganic compound such as a quantum dot or a high molecular compound (e.g., an oligomer, a dendrimer, and a polymer). For example, when used for the light-emitting layer, the quantum dot can function as a light-emitting material.

The quantum dot may be a colloidal quantum dot, an alloyed quantum dot, a core-shell quantum dot, a core quantum dot, or the like. A quantum dot containing elements belonging to Groups 12 and 16, elements belonging to Groups 13 and 15, or elements belonging to Groups 14 and 16 may be used. Alternatively, a quantum dot containing an element such as cadmium, selenium, zinc, sulfur, phosphorus, indium, tellurium, lead, gallium, arsenic, or aluminum may be used.

Examples of a material that can be used for the coloring layers include a metal material, a resin material, and a resin material containing a pigment or dye.

Examples of a material that can be used for the light-blocking layer include carbon black, a metal oxide, and a composite oxide containing a solid solution of a plurality of metal oxides. Stacked films containing the material of the coloring layer can also be used for the light-blocking layer. For example, a stacked-layer structure of a film containing a material of a coloring layer which transmits light of a certain color and a film containing a material of a coloring layer which transmits light of another color can be employed. It is preferable that the coloring layer and the light-blocking layer be formed using the same material because the same manufacturing apparatus can be used and the process can be simplified.

As a connection layer connecting an FPC and a terminal, an anisotropic conductive film (ACF), an anisotropic conductive paste (ACP), or the like can be used.

The above is the description of the components.

Example of Manufacturing Method

An example of a manufacturing method of a display device including a flexible substrate will be described below.

Here, layers each including a display element, a circuit, a wiring, an electrode, an insulating layer, optical members such as a coloring layer and a light-blocking layer, and the like are collectively referred to as an element layer. The element layer includes, for example, a display element, and may additionally include a wiring electrically connected to the display element or an element such as a transistor used in a pixel or a circuit.

In addition, here, a flexible member which supports the element layer at a stage at which the display element is completed (the manufacturing process is finished) is referred to as a substrate. For example, a substrate includes an extremely thin film with a thickness greater than or equal to 10 nm and less than or equal to 300 μm and the like.

As a method for forming an element layer over a flexible substrate provided with an insulating surface, typically, there are two methods shown below. One of them is to directly form an element layer over the flexible substrate. The other method is to form an element layer over a support substrate that is different from the flexible substrate and then to separate the element layer from the support substrate to be transferred to the substrate. Although not described in detail here, in addition to the above two methods, there is a method in which the element layer is formed over a substrate which does not have flexibility and the substrate is thinned by polishing or the like to have flexibility.

In the case where a material of the substrate can withstand heating temperature in a process for forming the element layer, it is preferable that the element layer be formed directly over the substrate, in which case a manufacturing process can be simplified. At this time, the element layer is preferably formed in a state where the substrate is fixed to the support substrate, in which case transfer thereof in an apparatus and between apparatuses can be easy.

In the case of employing the method in which the element layer is formed over the support substrate and then transferred to the substrate, first, a separation layer and an insulating layer are stacked over the support substrate, and then the element layer is formed over the insulating layer. Next, the element layer is separated from the support substrate and then transferred to the substrate. At this time, a material is selected such that separation occurs at an interface between the support substrate and the separation layer, at an interface between the separation layer and the insulating layer, or in the separation layer. With the method, it is preferable that a material having high heat resistance be used for the support substrate or the separation layer, in which case the upper limit of the temperature applied when the element layer is formed can be increased, and an element layer including a higher reliable element can be formed.

For example, a stacked layer of a layer containing a high-melting-point metal material, such as tungsten, and a layer containing an oxide of the metal material is used as the separation layer. Furthermore, a stacked layer of a plurality of layers, such as a silicon oxide layer, a silicon nitride layer, a silicon oxynitride layer, a silicon nitride oxide layer, and the like is preferably used as the insulating layer over the separation layer. Note that in this specification, oxynitride contains more oxygen than nitrogen, and nitride oxide contains more nitrogen than oxygen.

The element layer and the support substrate can be separated by applying mechanical force, by etching the separation layer, by injecting a liquid into the separation interface, or the like. Alternatively, separation may be performed by heating or cooling two layers of the separation interface by utilizing a difference in thermal expansion coefficient.

When separation is started, it is preferable that a separation starting point be formed first so that the separation proceeds from the starting point. The separation starting point can be formed, for example, by locally heating part of the insulating layer or the separation layer with laser light or the like or by physically cutting or making a hole through part of the insulating layer or the separation layer with a sharp tool.

The separation layer is not necessarily provided in the case where the separation can be performed at an interface between the support substrate and the insulating layer.

For example, glass is used for the support substrate and an organic resin such as polyimide is used for the insulating layer, in which case separation can be performed at an interface between the glass and the organic resin. The remaining organic resin such as polyimide can be used for the substrate.

Alternatively, a heat generation layer may be provided between the support substrate and the insulating layer formed of an organic resin, and separation may be performed at an interface between the heat generation layer and the insulating layer by heating the heat generation layer. As the heat generation layer, any of a variety of materials such as a material that generates heat by feeding current, a material that generates heat by absorbing light, and a material that generates heat by applying a magnetic field can be used. For example, a semiconductor, a metal, or an insulator can be selected for the heat generation layer.

The above is the description of the example of the manufacturing method.

Cross-Sectional Structural Example 2

Figure 22:
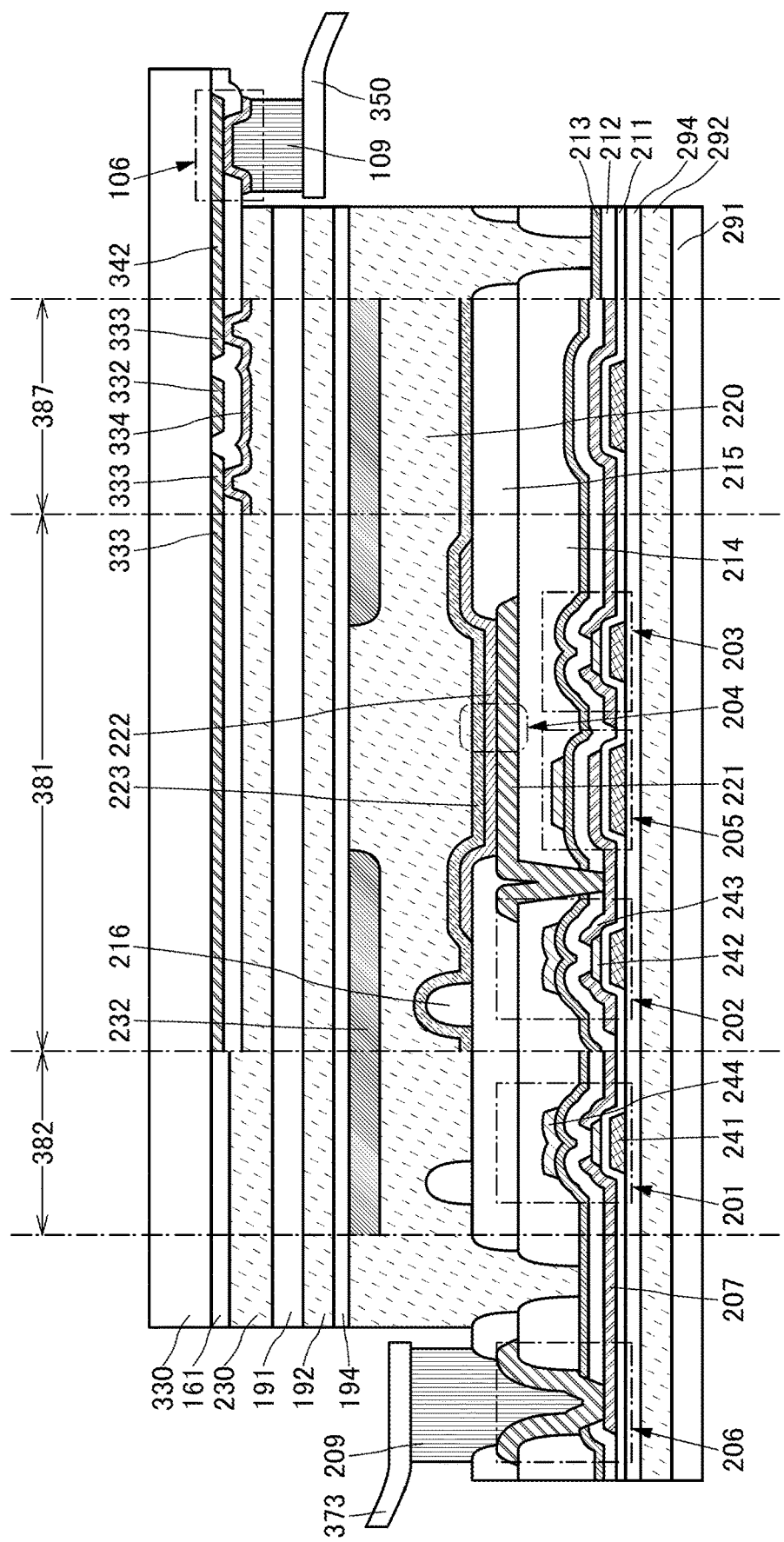
FIG. 22 illustrates a structural example of an input/output device of an embodiment.

FIG. 22 is a schematic cross-sectional view of the touch panel that is partly different from the structure of FIG. 21. Note that descriptions of the portions already described are omitted and different portions are described.

In the transistors 201 and 202, conductive layers 244 functioning as the second gates are provided between the insulating layer 213 and the insulating layer 214. Such a structure is preferable because the electric field intensity to be applied to the semiconductor layer 242 can be increased and the voltage to be applied to the second gates can be lowered as compared with the structure in FIG. 21.

FIG. 22 illustrates an example in which the display element 204 is formed by a separate coloring method. Specifically, pixels for different colors include different EL layers 222 which emit light of the respective colors. In a region outside the light-emitting region of the display element 204, an end portion of the EL layer 222 is covered with the second electrode 223. The EL layer 222 can be formed by, for example, an evaporation method using a metal mask, a printing method, or an inkjet method.

Although all of the layers in the EL layer 222 are formed separately here, one or more of a plurality of films included in the EL layer 222 can be separately formed and the others are not necessarily formed separately. For example, only the light-emitting layers are formed separately and the other layers are not necessarily formed separately. Furthermore, the red (R) light-emitting layer and the green (G) light-emitting layer can be formed separately and the blue (B) light-emitting layer and the other layers are not necessarily formed separately.

In the example illustrated in FIG. 22, the optical adjustment layer 224 and the coloring layer 231 illustrated in FIG. 21 are not provided.

Note that the structures of the transistors, the structure of the display element 204, and the like which are illustrated here can be replaced with those of the transistors, the display elements, and the like which are illustrated in FIG. 21 and in the following cross-sectional structures.

Cross-Sectional Structural Example 3

Figure 23:
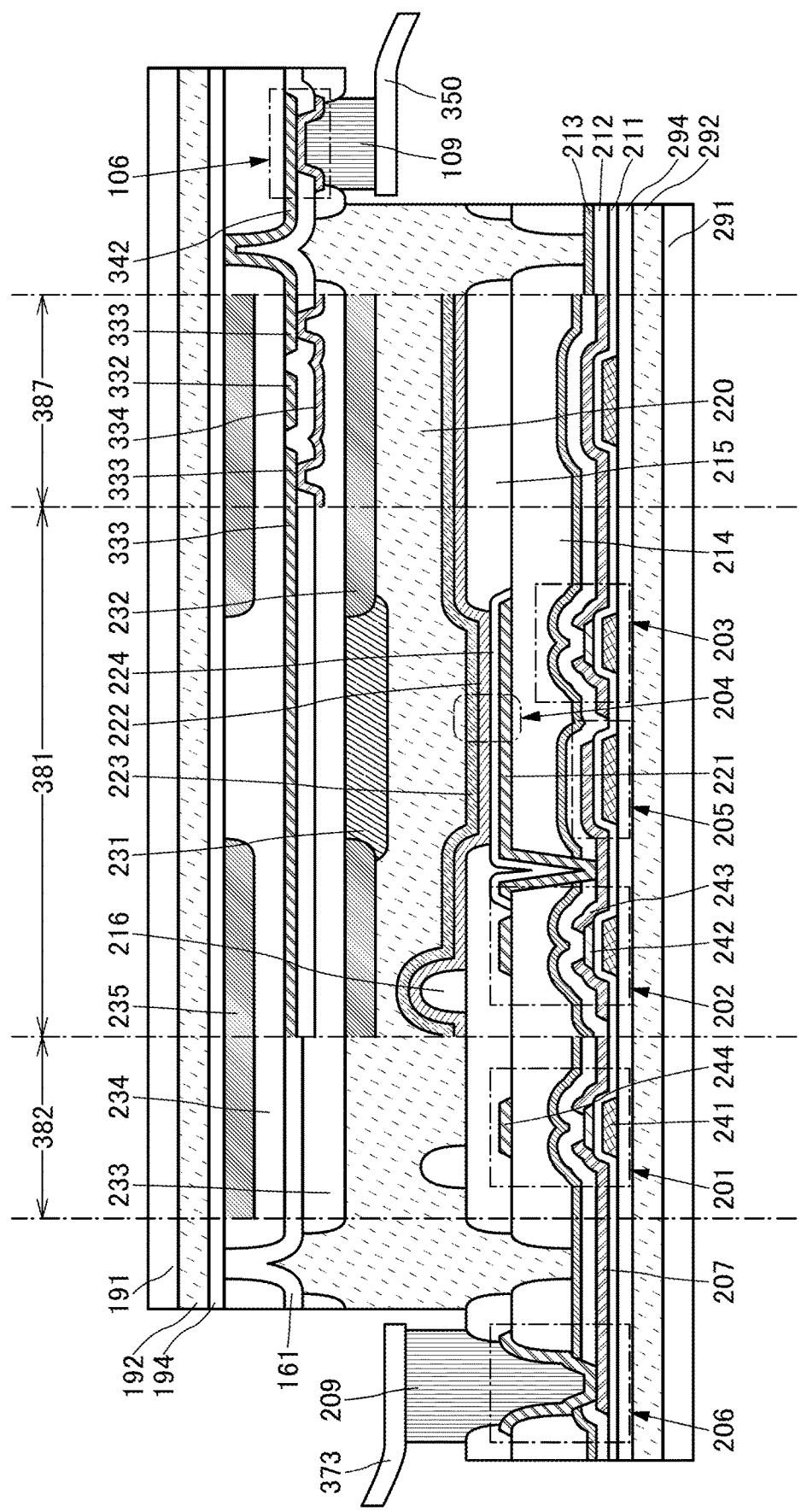
FIG. 23 illustrates a structural example of an input/output device of an embodiment.

In a touch panel illustrated in FIG. 23, the electrodes and the like in the touch sensor are formed between the substrate 191 and the substrate 291. The touch panel illustrated in FIG. 23 can also be referred to as an in-cell touch panel. In this structure, the input device and the display panel can share the substrate 191, so that a thin touch panel can be achieved.

In the touch panel illustrated in FIG. 23, a light-blocking layer 235, an insulating layer 234, the insulating layer 161, and the like are provided in this order on the surface on the substrate 291 side of the insulating layer 194. An insulating layer 233 is provided to cover the insulating layer 161, the bridge electrode 334, and the like. The light-blocking layer 232 and the coloring layer 231 are provided on the substrate 291 side of the insulating layer 233.

The insulating layers 233 and 234 have a function as a planarization film. Note that the insulating layers 233 and 234 are not necessarily provided when not needed.

The light-blocking layer 235 is provided in a position closer to the viewing side than that of the electrodes and the like in the touch sensor. This can prevent reflection of external light caused by the electrodes and the like, and the external light is less likely to be visually recognized by a user. Thus, a touch panel with improved visibility can be achieved.

Cross-Sectional Structural Example 4

Figure 24:
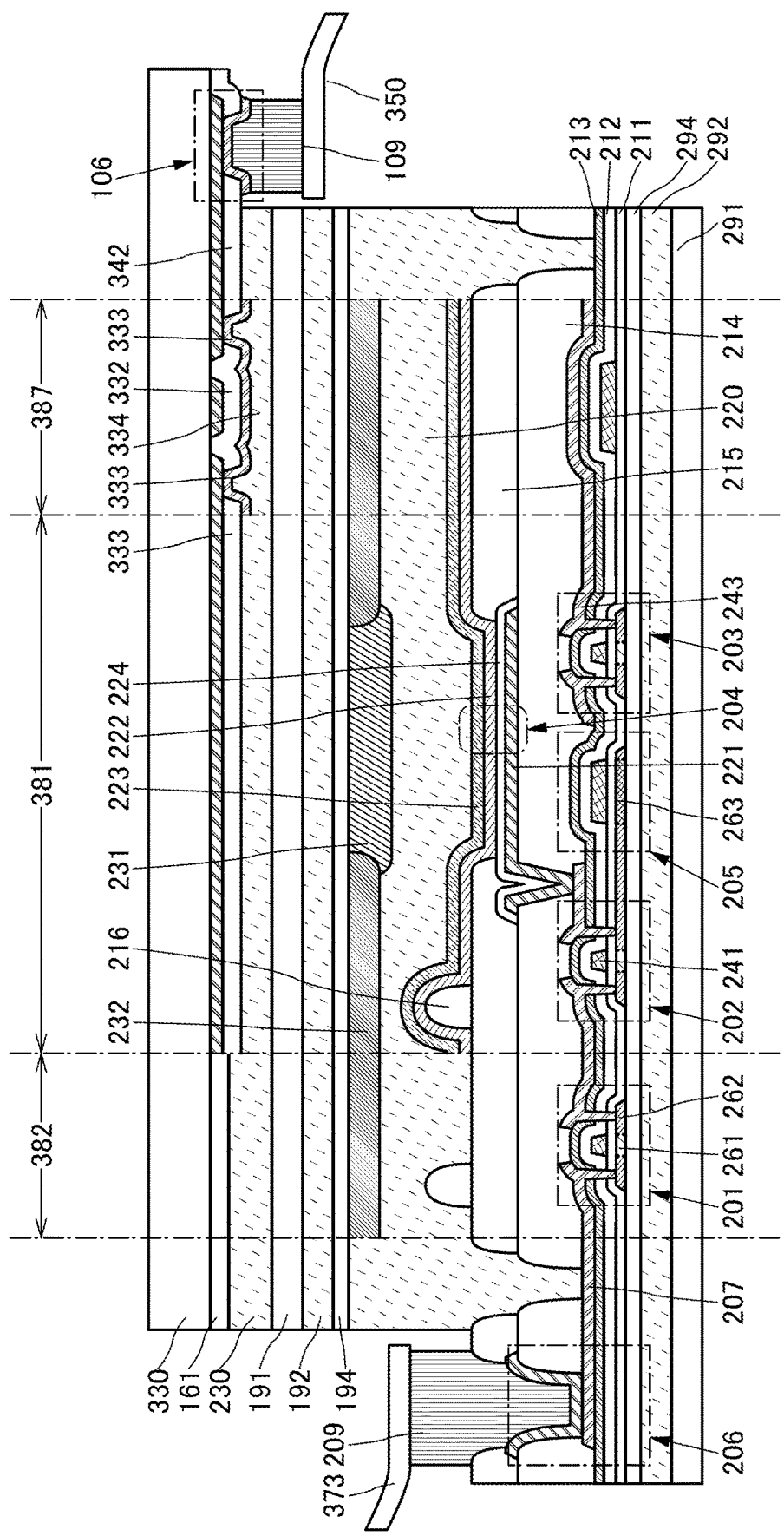
FIG. 24 illustrates a structural example of an input/output device of an embodiment.

FIG. 24 illustrates an example in which the transistors 201, 202, and 203 in the cross-sectional structural example illustrated in FIG. 21 each have a top-gate structure.

Each of the transistors includes a semiconductor layer 261, and the conductive layer 241 functioning as the gate is provided over the semiconductor layer 261 with the insulating layer 211 provided therebetween. The semiconductor layer 261 may include a low-resistance region 262.

The conductive layer 243 functioning as a source or a drain of the transistor is provided over the insulating layer 213 and electrically connected to the region 262 through an opening provided in the insulating layers 213, 212, and 211.

FIG. 24 illustrates an example in which the capacitor 205 has a stacked-layer structure including a layer formed by processing a semiconductor film used for the semiconductor layer 261, the insulating layer 211, and a layer formed by processing a conductive film used for the conductive layer 241. It is preferable that a region 263 having higher conductivity than a region where a channel of the transistor is formed be formed in part of the semiconductor film of the capacitor 205.

The regions 262 and 263 can be, for example, a region containing more impurities than the region where the channel of the transistor is formed, a region with a high carrier concentration, or a region with low crystallinity.

An impurity which can increase the conductivity depends on the kind of semiconductor used for the semiconductor layer 261; typically, a rare gas such as helium, neon, or argon, phosphorus, boron, hydrogen, lithium, sodium, magnesium, aluminum, nitrogen, fluorine, potassium, calcium, and the like can be given. In addition to the above elements, titanium, iron, nickel, copper, zinc, silver, indium, tin, or the like also functions as an impurity which influences the conductivity of the semiconductor. For example, when silicon is used as the semiconductor, phosphorus or the like is the element imparting n-type conductivity and boron or the like is the element imparting p-type conductivity.

Cross-Sectional Structural Example 5

Figure 25:
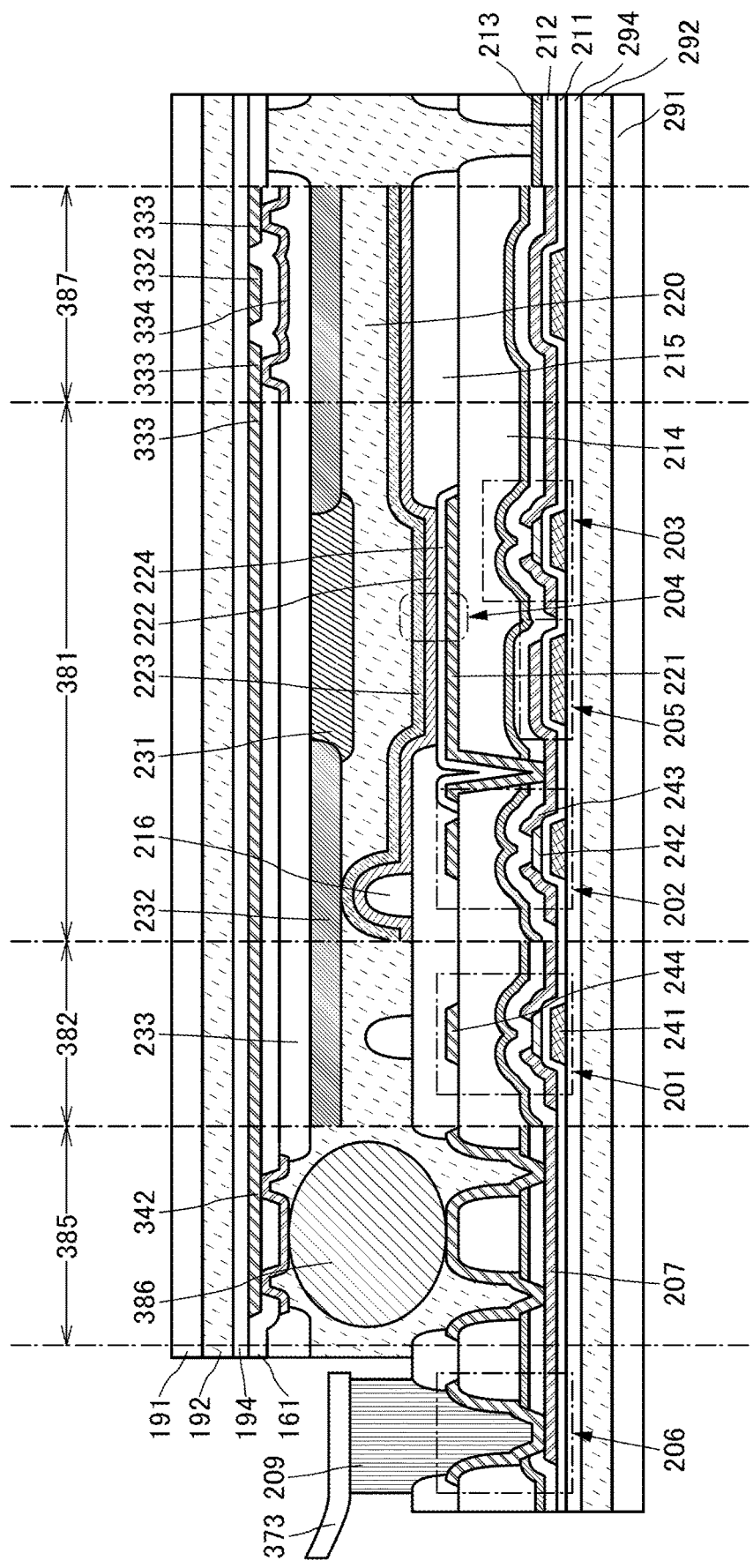
FIG. 25 illustrates a structural example of an input/output device of an embodiment.

FIG. 25 illustrates a cross-sectional structural example in which an FPC is provided only on one substrate side as illustrated in FIGS. 19A and 19B.

In a connection portion 385, a wiring 342 provided on the substrate 191 side and a wiring 207 provided on the substrate 291 side are electrically connected to each other through a connector 386.

As the connector 386, a conductive particle can be used, for example. As the conductive particle, a particle of an organic resin, silica, or the like coated with a metal material can be used. It is preferable to use nickel or gold as the metal material because contact resistance can be reduced. It is also preferable to use a particle coated with layers of two or more kinds of metal materials, such as a particle coated with nickel and further with gold. As the connector 386, a material capable of elastic deformation or plastic deformation is preferably used. As illustrated in FIG. 25, the conductive particle has a shape that is vertically crushed in some cases. With the crushed shape, the contact area between the connector 386 and a conductive layer electrically connected to the connector 386 can be increased, thereby reducing contact resistance and suppressing the generation of problems such as contact failure.

The connector 386 is preferably provided so as to be covered with the adhesive layer 220. For example, the connector 386 is dispersed in the adhesive layer 220 before curing of the adhesive layer 220. A structure in which the connection portion 385 is provided in a portion where the adhesive layer 220 is provided can be similarly used not only in a structure in which the adhesive layer 220 is also provided over the display element 204 as illustrated in FIG. 25 (also referred to as a solid sealing structure) but also in, for example, a hollow sealing structure in which the adhesive layer 220 is provided in the periphery of a light-emitting element, a liquid crystal display device, or the like.

The above is the description of the cross-sectional structural examples.

At least part of this embodiment can be implemented in combination with any of the other embodiments described in this specification as appropriate.

This application is based on Japanese Patent Application serial no. 2015-225499 filed with Japan Patent Office on Nov. 18, 2015, the entire contents of which are hereby incorporated by reference.

What is claimed is:
1. An electronic device comprising:
a display panel having flexibility, the display panel comprising a first portion, a second portion,
a first housing;
a second housing; and
a mechanism for slidably connecting the first housing to the second housing,
wherein the display panel is configured to be transformed along with sliding of the first housing and the second housing to have a folded state, a spread state, and a transition state that is between the folded state and the spread state,
wherein the first housing and the second housing are in contact with each other in each of the folded state, the spread state, and the transition state,
wherein when the display panel is spread in the spread state, the first portion, the second portion, and the third portion are in a same plane and wholly exposed to an outside,
wherein, in the spread state, the first portion and the third portion are positioned on a top surface of the first housing, and the second portion is positioned on a top surface of the second housing,
wherein when the display panel is folded in the folded state, the second portion is positioned over the first portion with the third portion therebetween, and exposed to the outside,
wherein, in the folded state, a part of the second portion overlaps with the first portion and the third portion, and the other part of the second portion does not overlap with the first portion or the third portion,
wherein in the folded state, the second housing is positioned over the first housing,
wherein, in the folded state, the second portion is positioned on the top surface of the second housing,
wherein, in the folded state, the first portion is not exposed to the outside, and a part of the third portion is positioned on one of side surfaces of the second housing,
wherein when the display panel is changed in shape in the transition state, an area of the first portion that is exposed to the outside is changed along with transformation of the display panel,
wherein a height of the first portion that is exposed in the transition state and a height of the second portion that is exposed in the transition state are different,
wherein, in the transition state, the height of the second portion that is exposed is maintained,
wherein in the folded state and the transition state, the third portion comprises a first curved portion where part of a surface of the third portion is convexly curved and a second curved portion where another part of the surface is concavely curved,
wherein in the folded state, the second curved portion is positioned on the first portion side and the first curved portion is positioned on the second portion side, and
wherein an area of the second portion is larger than the area of the first portion.
2. The electronic device according to claim 1,
wherein in the transition state, the third portion is changed in shape to change a width between the first curved portion and the second curved portion so that relative positions of the first portion and the second portion are changed while the first portion and the second portion maintain a state parallel to each other.

3. The electronic device according to claim 1, further comprising:
- a first lock mechanism for locking relative positions of the first housing and the second housing when the display panel is spread; and
- a second lock mechanism for locking the relative positions of the first housing and the second housing when the display panel is folded and the first portion is covered with at least one of the second portion and the second housing.

* * * * *